(12) United States Patent  
Noda et al.

(10) Patent No.: US 6,424,586 B1
(45) Date of Patent: Jul. 23, 2002

(54) SEMICONDUCTOR INTEGRATED CIRCUIT DEVICE AND METHOD OF ACTIVATING SAME

(75) Inventors: Hiromasa Noda, Tokyo; Masakazu Aoki, Tokorozawa; Youji Idei, Asaka; Kazuhiko Kajigaya, Iruma; Osamu Nagashima, Hamura; Kiyoo Itoh, Higashikurume; Masashi Horiguchi, Kawasaki; Takeshi Sakata, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/040,435

(22) Filed: Jan. 9, 2002

Related U.S. Application Data

(63) Continuation of application No. 09/875,169, filed on Jun. 7, 2001, which is a continuation of application No. 09/729,273, filed on Dec. 5, 2000, now Pat. No. 6,275,440, which is a continuation of application No. 08/985,425, filed on Oct. 5, 1997, now Pat. No. 5,926,430, which is a continuation of application No. 08/762,883, filed on Dec. 12, 1996, now Pat. No. 5,724,297.

(30) Foreign Application Priority Data

Dec. 21, 1995 (JP) .............................................. 7-349718

(51) Int. Cl.$^7$ ................................................ G11C 7/00
(52) U.S. Cl. ........................................ 365/227; 365/226
(58) Field of Search ................................ 365/226, 227, 365/228, 229, 230.03

(56) References Cited

U.S. PATENT DOCUMENTS

| 5,408,144 A | 4/1995 | Sakata ........................ 365/226 |
|---|---|---|
| 5,521,527 A | 5/1996 | Sakata et al. ................. 326/21 |
| 5,541,885 A | 7/1996 | Takashima .................. 365/226 |
| 5,574,697 A | 11/1996 | Manning ..................... 365/226 |
| 5,583,457 A * | 12/1996 | Horiguchi et al. .......... 326/121 |
| 5,604,707 A | 2/1997 | Kuge et al. .................. 365/226 |
| 5,615,162 A | 3/1997 | Houston ...................... 365/226 |
| 5,659,517 A | 8/1997 | Arimoto et al. ............. 365/226 |
| 5,724,297 A | 3/1998 | Noda et al. .................. 365/226 |
| 5,726,946 A | 3/1998 | Yamagata et al. .......... 365/226 |
| 5,751,651 A | 5/1998 | Ooishi ......................... 365/226 |
| 5,781,494 A | 7/1998 | Bae et al. ............... 365/230.03 |
| 5,798,976 A * | 8/1998 | Arimoto ...................... 365/226 |
| 5,872,737 A | 2/1999 | Tsuruda et al. ......... 365/189.05 |

FOREIGN PATENT DOCUMENTS

| JP | 5-268065 | 10/1993 |
|---|---|---|
| JP | 5-347550 | 12/1993 |
| JP | 6-29834 | 2/1994 |
| JP | 6-237164 | 8/1994 |
| JP | 6-311012 | 11/1994 |
| JP | 7-86916 | 3/1995 |
| JP | 8-83487 | 3/1996 |

* cited by examiner

*Primary Examiner*—Son L. Mai
(74) *Attorney, Agent, or Firm*—Antonelli, Terry, Stout & Kraus, LLP

(57) ABSTRACT

A dynamic RAM is divided into an input circuit block responsive to an input signal supplied from an external terminal, inclusive of an operation start signal, an internal circuit block activated in response to the signal inputted from the input circuit block, and an output circuit block for outputting a signal outputted from the internal circuit block to an external terminal. A plurality of switch MOSFETs are provided in parallel form between a power line for applying an operating voltage supplied from an external terminal and an internal power line for a first circuit portion in the internal circuit block, which does not need a storage operation upon its non-operating state. Further, the switch MOSFETs are stepwise turned on in response to controls signals produced by delaying a start signal supplied through the input circuit block in turn, so as to perform the supply of each operating voltage.

2 Claims, 18 Drawing Sheets

FIG. 15
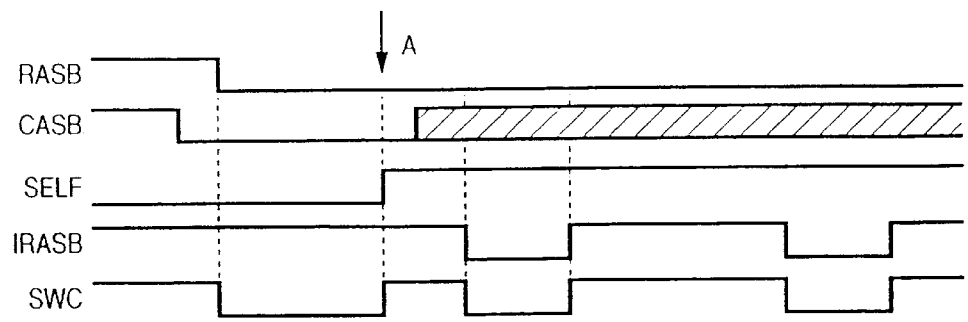
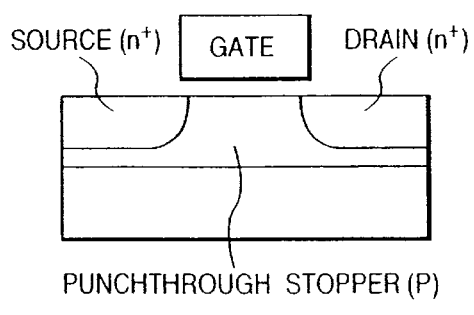
FIG. 16A
TRANSISTOR HAVING CONVENTIONAL STRUCTURE (n CHANNEL)
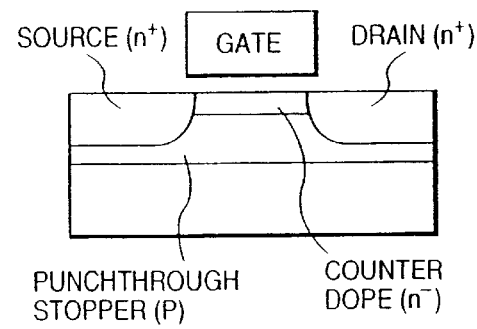
FIG. 16B
COUNTERDOPED TRANSISTOR (n CHANNEL)

SEMICONDUCTOR INTEGRATED CIRCUIT DEVICE AND METHOD OF ACTIVATING SAME

CROSS-REFERENCE TO RELATED APPLICATIONS

This is a continuation of application Ser. No. 09/875,169, filed Jun. 7, 2001; which is a continuation of application Ser. No. 09/729,273, filed on Dec. 5, 2000 now U.S. Pat. No. 6,275,440; which is a continuation of application Ser. No. 08/985,425, filed on Oct. 5, 1997 (now U.S. Pat. No. 5,926,430), which is a continuation of application Ser. No. 08/762,883 filed Dec. 12, 1996 now U.S. Pat. No. 5,724,297, the entire disclosures of which are hereby incorporated by reference.

BACKGROUND OF THE INVENTION

The present invention relates to a semiconductor integrated circuit device and a method of operating it, and principally to a technique effective for use in a digital integrated circuit device such as a dynamic RAM (Random Access Memory) comprising CMOS circuits each composed of low threshold-voltage type MOSFETs and in a method of operating the digital integrated circuit device.

MOSFETs are reduced in withstand voltage with their micronization. It is therefore necessary to reduce an operating voltage of a circuit composed of the MOSFETs shaped in micro form. Since a gate voltage supplied to the gate of each MOSFET is also lowered in this case, it is necessary to reduce the threshold voltage of the MOSFET so that even the lowered gate voltage provides the flow of a desired current. However, when the threshold voltage is reduced, a leakage current (hereinafter called "subthreshold leakage current"), which flows when each MOSFET is brought into an off state in which the gate and source thereof are equal in voltage to each other, increases exponentially. Thus, even in the case of a CMOS circuit, current consumption at its deactivation increases.

A circuit for reducing the subthreshold leakage current referred to above has been disclosed in Japanese Patent Application Laid-Open Nos. 6(1994)-237164 and 8(1996)-83487 and U.S. Pat. Nos. 5,274,601 and 5,408,144 by way of illustrative example. As a method of reducing the leakage current by the present circuit, a CMOS inverter circuit at the time that an input thereof at its non-operation and an output thereof have been determined as a high level and a low level respectively, will be described by way of example. In this case, a P channel MOSFET of the CMOS inverter circuit is in an off state and an N channel MOSFET thereof is in an on state. A leakage current produced in the CMOS inverter circuit is determined depending on the subthreshold leakage current of the turned-off P channel MOSFET.

A P channel power switch MOSFET is provided between an operating voltage node connected to the source of the P channel MOSFET of the CMOS inverter circuit and a power line and is turned off upon the non-operation. In doing so, the potential at each internal power line placed in a floating state is reduced by the subthreshold leakage current. When the potential is reduced to a some extent, a reverse bias voltage is applied between the gate and source of the P channel MOSFET of the CMOS circuit so that the subthreshold leakage current can be substantially eliminated.

SUMMARY OF THE INVENTION

The inventors of the present application have discussed the application of a method of reducing a subthreshold leakage current to a dynamic RAM. In this case, the present inventors have found out various problems to be solved without sacrificing the operating speed of the dynamic RAM and to effectively reduce the subthreshold leakage current. Namely, an internal power switch MOSFET is turned off upon standby to reduce the subthreshold leakage current and is turned on upon memory access. In doing so, a pulse-shaped large current will flow when a control signal for changing such a MOSFET from the off state to the on state rises and the power node of the internal circuit is charged up according to the turning on of the MOSFET. This pulsating current will increase the value of the peak current of a semiconductor integrated circuit device. Upon mounting of a system, the current capacity of a power device must be increased so as to correspond to the peak value.

The increase in the circuit function and circuit scale of the semiconductor integrated circuit device and the reduction in its source voltage with the device micronization as described above tends toward a size reduction of a system such as a portable electronic device or the like. A battery is also expected to be inevitably used as a power supply. However, the increase in peak current offers a large problem as viewed from the power device of the system, which needs its size reduction. Even in the case of the semiconductor integrated circuit device, large noise is produced in the power-line with the occurrence of the peak current referred to above and hence an operating margin thereof is made worse.

An object of the present invention is to provide a semiconductor integrated circuit device capable of realizing less power consumption while ensuring its operating-margin. Another object of the present invention is to provide a semiconductor integrated circuit device capable of realizing high integration, a voltage reduction and less power consumption without sacrificing its operating speed.

The above and other objects, novel features and advantages of the present invention will become apparent from the following description and the appended claims of the present specification, taken in conjunction with the accompanying drawings in which preferred embodiments of the present invention are shown by way of illustrative example.

A summary of a typical one of the inventions disclosed in the present application will be described in brief as follows: A plurality of switch MOSFETs are provided in parallel form between internal power lines for a plurality of circuit blocks divided for every functions and respectively set so as to perform circuit operations in response to operation control signals and a power line for delivering an operating voltage supplied from an external terminal. These switch MOSFETs are turned on in domino or stepwise form in response to control signals produced by successively delaying the operation control signals, so as to provide the supply of operating voltages.

A summary of another typical one of the inventions disclosed in the present application will be described in brief as follows: A dynamic RAM is divided into an input circuit block responsive to an input signal supplied from an external terminal, inclusive of an operation start signal, an internal circuit block activated in response to the signal inputted from the input circuit block, and an output circuit block for outputting a signal outputted from the internal circuit block to an external terminal. A plurality of switch MOSFETs are provided in parallel form between a power line for applying an operating voltage supplied from an external terminal and an internal power line for a first circuit portion in the internal circuit block, which does not need a storage operation upon its non-operating state. Further, the switch MOSFETs are turned on in domino or stepwise form in response to control signals produced by delaying a start signal supplied through the input circuit block in turn, so as to perform the supply of each operating voltage.

BRIEF DESCRIPTION OF THE DRAWINGS

The invention will now be described with reference to the accompanying drawings wherein:

FIG. 15 is a timing chart for describing one example of the operation of the X-system input unit shown in FIG. 14;

FIGS. 16A and 16B are respectively schematic structural sectional views showing examples of MOSFETs employed in the semiconductor integrated circuit device according to the present invention;

FIG. 18 is a characteristic diagram showing the relationship between a peak current, a delay time of a switch MOSFET start signal and the like;

DETAILED DESCRIPTION OF THE PREFERRED EMBODIMENTS

Preferred embodiments of the present invention will hereinafter be described with reference to the accompanying drawings.

Figure 1:
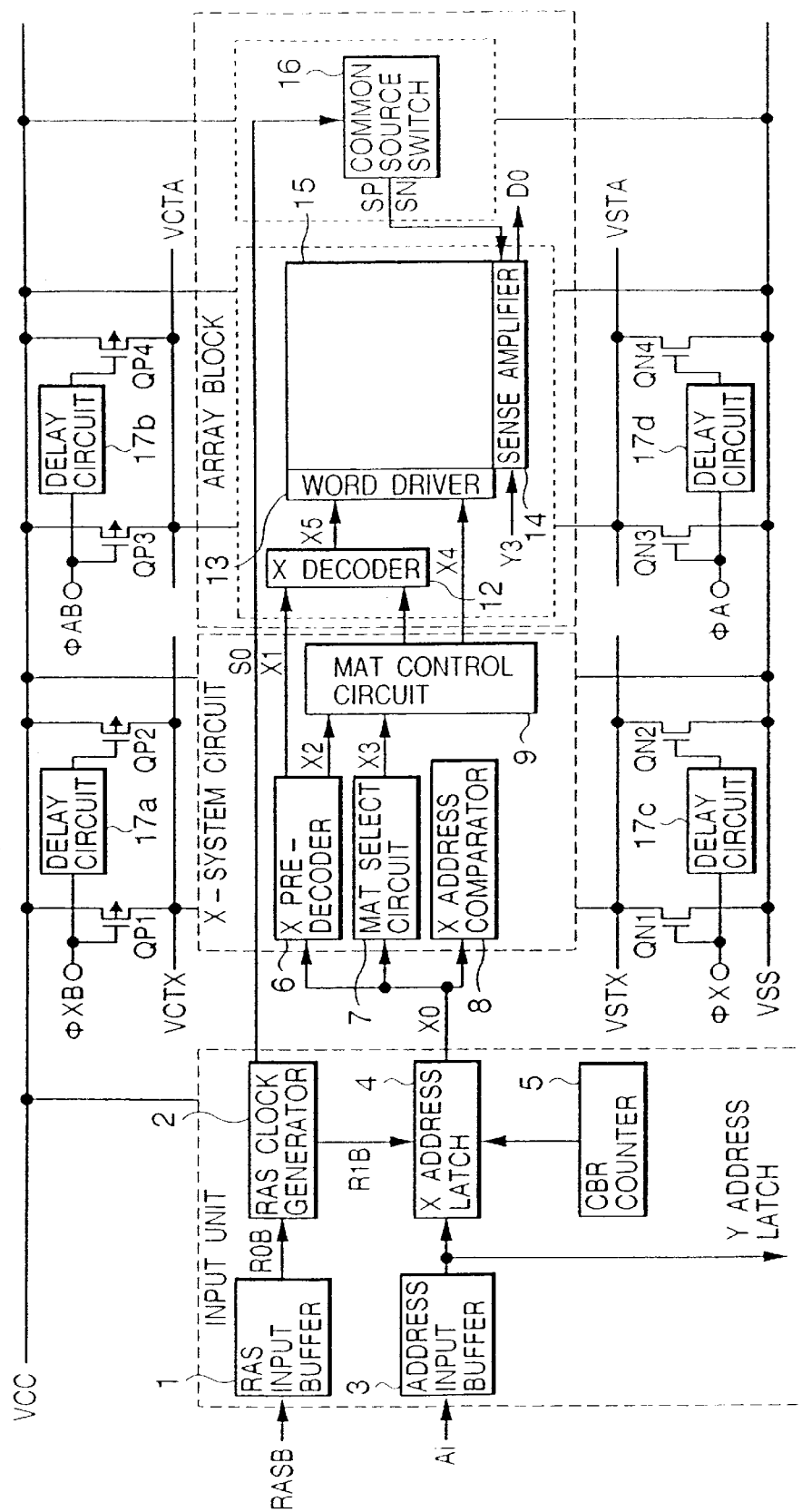
FIG. 1 is a block diagram principally showing examples of an input unit, an X-system circuit and an array block employed in a dynamic RAM to which the present invention is applied.
Figure 2:
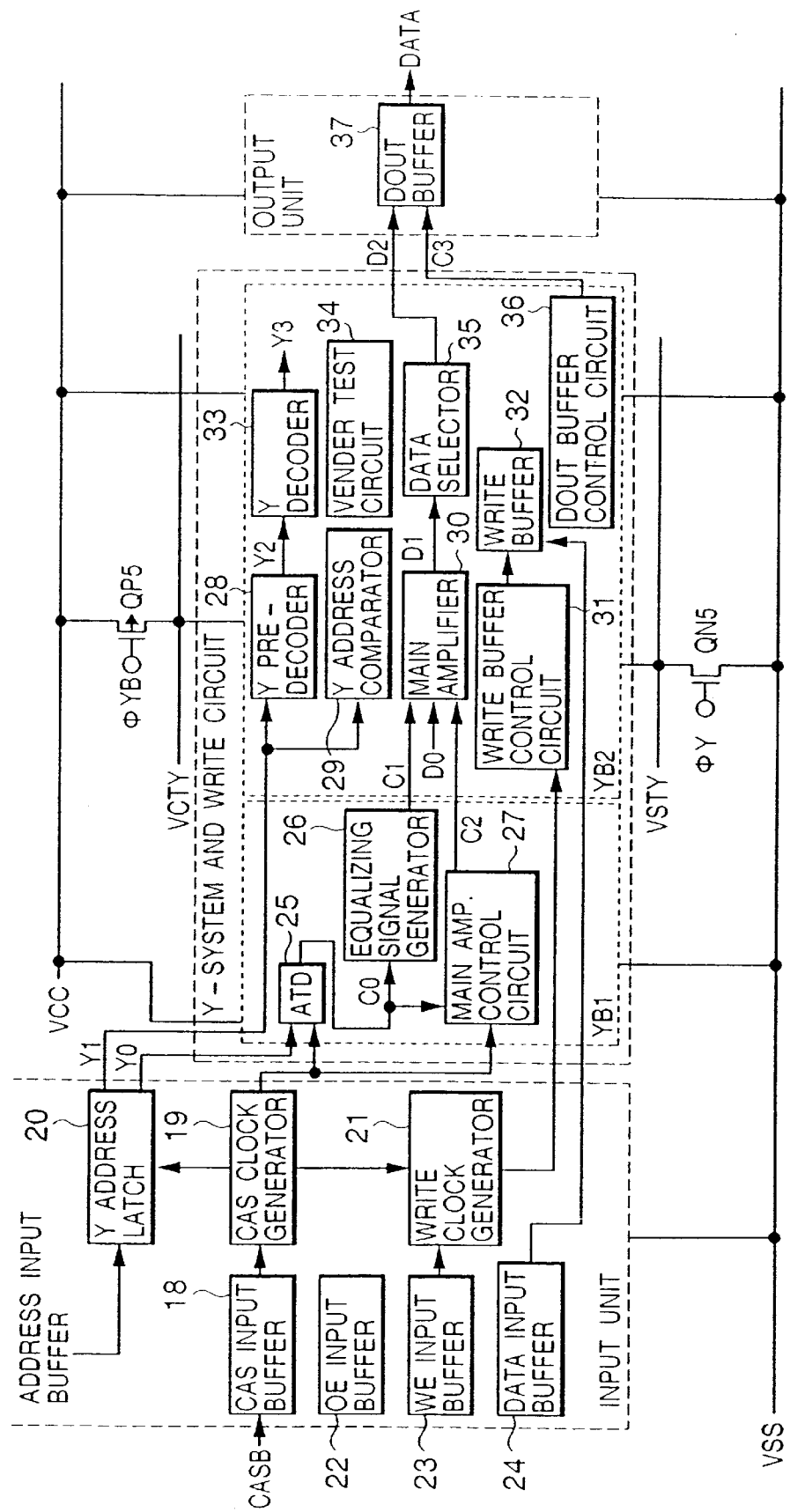
FIG. 2 is a block diagram principally illustrating examples of a Y-system and write circuit and an output buffer employed in the dynamic RAM to which the present invention is applied.

FIGS. 1 and 2 are block diagrams showing one embodiment of a dynamic RAM to which the present invention is applied. FIG. 1 principally illustrates an input unit, an X-system circuit and an array block. FIG. 2 shows a Y-system and write circuit and an output buffer. In the same drawings, signal transfer paths employed in the present dynamic RAM do not faithfully correspond to signal transfer paths as described in the normal circuit blocks to provide easy understanding of the present invention. Further, the same drawings are mainly plotted from the viewpoint of the supply of an operating voltage to each circuit block.

The dynamic RAM according to the present embodiment is roughly divided into circuits each placed in a state of being supplied with a power source at all times from the relationship with the outside, for example, as in an input unit and an output (circuit) unit such as the output buffer or the like, and internal circuits other than the circuits referred to above. Therefore, the respective circuits, which constitute the above-described input unit, and an output circuit typified by the output buffer and a circuit having the need for a memory operation, of the internal circuits, are respectively electrically connected to a source voltage VCC supplied from an external terminal and a circuit ground potential VSS.

On the other hand, each internal circuit for forming a low-level output signal when a memory in a CMOS circuit is in a non-operating state, in other words, in a standby state to reduce a subthreshold leakage current, has a source voltage side electrically connected to sub power lines or sub voltage interconnections or wires (first internal power line). Further, each internal circuit for forming a high-level output signal has a ground side electrically connected to subground lines (second internal power line).

In the present embodiment, the internal circuits are roughly classified into a X-system circuit and a Y-system circuit to reduce a peak current at the time of the supply of the voltage to the above-described each internal power line without sacrificing a substantial operating speed. This is because they are different in operating timing from each other. Further, the X-system circuit is further separated into two portions: an X-system circuit for forming a word line select signal and a portion (circuit portion) provided within the array block, for forming a word-line select signal.

The sub power lines are classified into VCTX, VCTA and VCTY according to the division of the internal blocks as described above, and the subground lines are separated into VSTX, VSTA and VSTY. Although not restricted in particular, a plurality of P channel switches MOSFETS QP1 and QP2, and QP3 and QP4 are respectively provided in parallel form between the sub power line VCTX and the power line VCC and between the sub power line VCTA and the power line VCC. Although not limited in particular, a plurality of N channel switches MOSFETs QN1 and QN2, and QN3 and QN4 are respectively provided in parallel form between the subground line VSTX and the ground line (first main voltage interconnection or wire) VSS and between the subground line VSTA and the ground line VSS.

These P channel and N channel switches MOSFETs divided into the two are respectively supplied with control signals φXB and φX, and φAB and φA. These control signals φXB and φX, and φAB and φA are shifted in timing provided to generate them. The control signals φXB and φX are generated in relatively quick timing in association with their operation sequences. The control signals φAB and φA are generated in relatively slow timing.

The control signal φXB is not supplied commonly to the gates of the P channel switches MOSFETs QP1 and QP2, which are provided between the sub power line VCTX and the power line (second main voltage interconnection or wire) VCC associated with the above-described X-system circuit and which are connected to one another in parallel form. Namely, the control signal φXB is supplied to the MOSFET QP1 corresponding to the input side and a signal obtained by delaying the same control signal through a delay circuit (control circuit) 17a is supplied to the MOSFET QP2 corresponding to the output side. In the same drawing, the two switches MOSFETs QP1 and QP2 are typically illustrated by way of example. However, the X-system circuit is composed of multistage logic circuits which constitute an X predecoder 6, a mat select circuit 7, an X address comparator 8 for making a comparison between redundant addresses, a mat control circuit 9, etc.

The sub power line VCTX for supplying an operating voltage to these logic circuits extends along a circuit area where it is formed. Therefore, a number of switch MOSFETs as in the switches MOSFETs QP1 and QP2 are provided in parallel form between the sub power line VCTX and the power line VCC so as to provide a desired current supply ability by their composite conductance. In other words, one switch MOSFET is formed into a relatively small size in such a manner that the current supply ability required to activate the X-system circuit can be shared between the plurality of MOSFETs and realized by them.

In the same manner as described above, the control signal φX is not supplied commonly to the gates of the N channel switches MOSFETs QN1 and QN2, which are provided between the subground line VSTX and the ground line VSS associated with the above-described X-system circuit and which are connected to one another in parallel form. Namely, the control signal φX is supplied to the MOSFET QN1 corresponding to the input side and a signal obtained by delaying the same control signal through a delay circuit 17c is supplied to the MOSFET QN2 corresponding to the output side. Even in the case of the switches MOSFETs QN1 and QN2 in a manner similar to the MOSFETs QP1 and QP2, a number of MOSFETs are provided in parallel form between the subground line VSTX and the ground line VSS so as to provide a desired current supply ability by their composite conductance.

Such a switch MOSFET division can bring about the following advantages. One of them is that since the switches MOSFETs are respectively dispersed and formed between the power line VCC and the sub power line VCTX and between the subground line VSTX and the ground line VSS, the degree of freedom of the layout of these MOSFETs can be increased. Namely, the degree of freedom thereof can be realized by suitably providing relatively small MOSFETs within spaces defined between the former two lines and between the latter two lines. By successively activating these MOSFETs in a domino mode, they can be directly driven by relatively small inverter circuits or inverters respectively constituting the delay circuits 17a and 17c, so that a drive current supplied to the gate of each switch MOSFET is dispersed so as to control or suppress the peak current.

Similarly, since the switches MOSFETs are reduced in size, the value of current that flows when each switch MOSFET is turned on, is rendered relatively small, and the switches MOSFETs are successively turned on in the domino mode, the current, which flows in each internal circuit in the X-system circuit, can be also dispersed on a time basis so as to suppress the peak current. By determining the order of activating the MOSFETs in the domino mode in line with a signal transfer mode, the signal can be transferred with satisfactory efficiency by less current as will be described later.

The P channel switches MOSFETs QP3 and QP4 provided between the sub power line VCTA and the power line VCC provided so as to correspond to the array block, and the N channel switches MOSFETs QN3 and QN4 provided between the subground line VSTA and the ground line VSS are also configured in the same manner as described above. Further, the switches MOSFETs QP3 and QP4 and QN3 and QN4 are switch-controlled on a stepwise basis by the control signals φAB and φA generated with the delay and delay signals produced by delay circuits 17b and 17d.

The array block comprises an X decoder 12, a memory array 15, a word driver 13 and a sense amplifier 14. One memory mat is composed of a combination of the memory array 15, the X decoder 12 and the sense amplifier 14 and hence a plurality of memory mats are provided as a whole. Therefore, the X decoder 12 associated with a memory mat selected by the mat control circuit is activated to thereby select a pair of word lines in its corresponding memory array 15. Thereafter, the stored information read into a pair of bit lines by the selection of the pair of word lines is amplified by the corresponding sense amplifier 14.

In the present embodiment, in order to ensure a relatively large current required to perform the operation of amplification of each sense amplifier, a common source switch 16 for forming a signal for activating the sense amplifier is not electrically connected to the sub power line VCTA and the subground line VSTA described above but is electrically connected directly to the power line VCC and the ground line VSS. This is similar even to the output buffer which needs the flow of a large output current.

The sub power line VCTY and the subground line VSTY are provided so as to correspond to the Y-system and write circuit. Although not limited in particular, a single P channel switch MOSFET QP5 is provided between the sub power line VCTY and the power line VCC. Although not restricted in particular, a single N channel switch MOSFET QN5 is provided between the subground line VSTY and the ground line VSS. Each of the switch MOSFETs QP5 and QN5 is formed in a relatively large size so as to provide the flow of current required to activate the Y-system and write circuit.

However, control signals φYB and φY are set so that their rising edges are unsharpened to suppress a peak current for driving each switch MOSFET and a peak current at the time that each switch MOSFET is turned on. As the simplest method, may be mentioned a method of forming the control signals φYB and φY by a drive circuit such as an inverter or the like having only such small conductance as to increase the time constant of a gate capacitor of each of the switches MOSFETs QP5 and QN5 formed into the relatively large sizes.

Since the current required to vary a gate voltage supplied to each of the gates of the MOSFETs QP5 and QN5 is less provided and the MOSFETs QP5 and QN5 are gently brought into an on state owing to the adoption of such a construction, the peak value of the current supplied to each of the sub power line VCTY and the subground line VSTY can be suppressed. Thus, when the above construction is applied to the Y-system circuit, a relatively long time exists until the Y-system circuit is activated since a low address strobe signal RASB is rendered low in level and thereby a memory access is started. Therefore, the switches MOSFETs can be set so as to have a current supply ability necessary for the above operation after the elapse of a desired time in such a simple configuration that each power switch MOSFET is driven by an inverter circuit having a low current supply ability.

In the Y-system and write circuit, an address signal variation detector ATD detects a change in Y address signal and starts an equalizing signal generator 26 and a main amplifier control circuit so as to equalize an input node of a main amplifier and control the operation of amplification of the main amplifier. Each circuit block YB1 is electrically connected directly to the power line VCC and the ground line VSS without being electrically connected to the sub power line VCTY and the subground line VSTY to stabilize its operation.

Other circuit blocks in the Y-system and write circuit are electrically connected to the sub power line VCTY and the subground line VSTY. Of these circuits, reference numerals 28, 33, 29, 30, 31, 32, 34 and 36 respectively indicate a Y predecoder, a Y decoder, a Y address comparator for making a comparison between redundant addresses, a main amplifier, a write buffer control circuit, a write buffer, a vender test circuit, and a Dout buffer control circuit.

The input (circuit) unit for receiving therein a signal inputted from an external terminal is regularly supplied with operating voltages through the power line VCC and the ground line VSS to ensure a response to the input signal supplied from the external terminal. Further, the output buffer for forming an output signal is regularly supplied with the operating voltages through the power line VCC and the ground line VSS to stably provide the output signal.

The input unit is provided, as an X system, with a RAS input buffer 1, a clock generator 2 for producing a RAS clock signal in response to a signal outputted from the RAS input buffer 1, an address input buffer 3 supplied with an address signal, an X address latch 4 for taking in the address signal in response to the RAS clock signal R1B, and a CBR counter 5 for producing an address signal used for a refresh operation.

The input unit includes, as a Y system, a CAS input buffer 18, a clock generator 19 for producing a CAS clock signal in response to a signal outputted from the CAS input buffer 18, and a Y address latch 20 for capturing a Y address signal inputted from the address input buffer 3 in response to the CAS clock signal. In addition to the components, the input unit has an output enable input buffer 22, a write enable input buffer 23 and a data input buffer 24.

Figure 3:
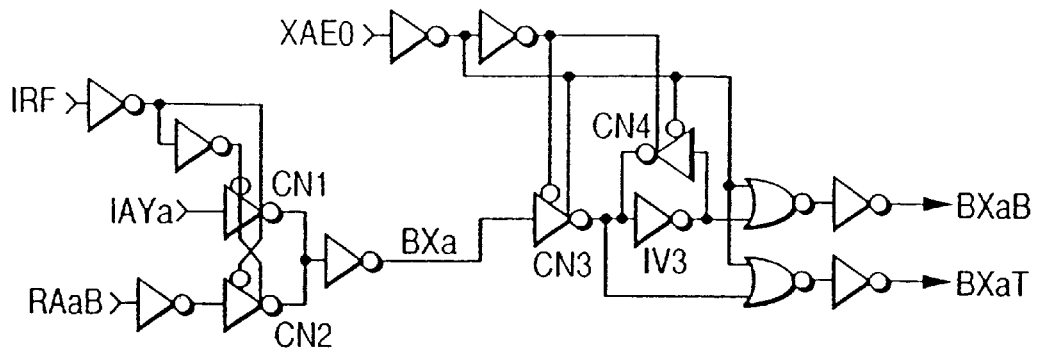
FIG. 3 is a circuit diagram showing one example of an X-system address input unit employed in the dynamic RAM to which the present invention is applied.

FIG. 3 is a circuit diagram showing one example of the X-system address input unit. An address signal IAYa is of a refresh address signal formed by the CBR counter 5 shown in FIG. 1. An address signal RAaB is of an X-system address signal supplied from the external terminal. These two address signals are supplied to their corresponding inputs of clocked inverter circuits CN1 and CN2. A refresh control signal IRF is brought to a high level upon refresh operation to thereby activate the clocked inverter circuit CN1 and bring the clocked inverter circuit CN2 into an output high impedance, whereby the refresh address signal IAYa is captured. When the refresh signal IRF is low in level, the clocked inverter circuit CN1 is brought to an output high impedance and the clocked inverter circuit CN2 is brought into an operation state, whereby the row-system address signal RAaB supplied from the external terminal is captured.

Outputs produced from the two clocked inverter circuits CN1 and CN2 are commonly used and transmitted to a through latch via an inverter circuit. The through latch comprises an input clocked inverter circuit CN3, an inverter circuit IV3 and a feedback clocked inverter circuit CN4. A timing signal XAE0 is of a row-system timing signal and is used to allow the through latch to perform a latch operation. Namely, when the timing signal XAE0 is low in level, the input clocked inverter circuit CN3 is activated so that the feedback clocked inverter circuit CN4 is brought to an output high impedance. Therefore, the address signal RAaB inputted from the external terminal or the refresh address signal IAYa is captured through the input clocked inverter circuit CN3.

When the level of the timing signal XAE0 is changed from the low level to the high level, the input clocked inverter circuit CN3 is brought to an output high impedance and alternatively, the feedback clocked inverter circuit CN4 is brought into an operating state. Therefore, a signal outputted from the inverter circuit IV3 is fed back to the input side so that the captured address referred to above is latched in the through latch. Signals produced from the through latch are outputted as complementary internal address signals BXaB and BXaT through NOR gate circuits and inverter circuits. The NOR gate circuits respectively open their gates during a period in which the timing signal XAE0 is high in level to thereby output the complementary internal address signals BXaB and BXaT corresponding to the latched address signal. When the timing signal XAE0 is in a standby state of being brought to a low level in contrast with this, the internal address signals BXaB and BXaT are both fixed to a high level and respective signals at the subsequent logic stages are respectively fixed to a predetermined signal level without reference to the previous memory access.

Figure 4:
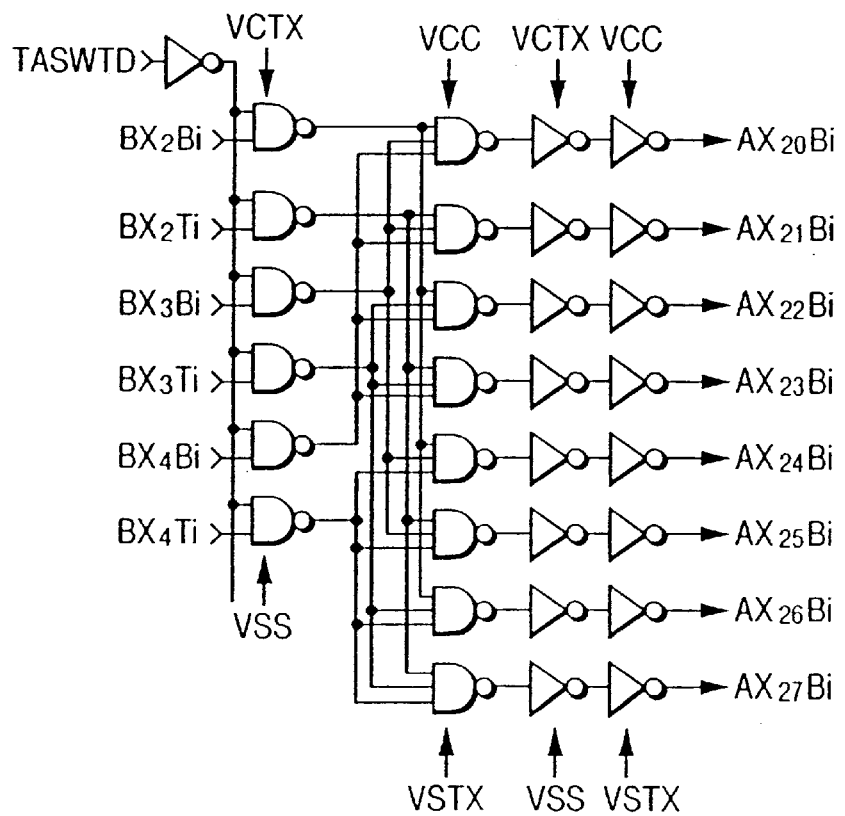
FIG. 4 is a circuit diagram depicting one example of a predecoder supplied with an internal address signal, which is employed in the dynamic RAM to which the present invention is applied.

FIG. 4 is a circuit diagram showing one example of the predecoder which receives the internal address signals therein. Although not restricted in particular, complementary internal address signals BX2Bi, BX2Ti through BX4Bi and BX4Ti captured by the address input unit referred to above are captured through NAND gate circuits whose gates are controlled based on a testing control signal TASWTD. Eight predecode outputs AX2OBi through AX27Bi are produced from NAND gate circuits by utilizing the complementary internal address signals BX2Bi, BX2Ti through BX4Bi and BX4Ti composed of three bits in combination.

The predecode outputs are respectively outputted through two cascade-connected inverter circuits used as output buffers. T in each signal referred to above indicates non-inversion (true) and B in each signal indicates inversion (bar). An explanation of the testing control signal TASWTD will be omitted because it has no immediate connection with the present invention. However, when the testing control signal TASWTD is rendered high in level, the gates of the NAND gate circuits are closed so that the signals inputted to the respective NAND gate circuits that constitute the predecoder, are all brought to a high level without reference to the address signals BX2Bi, BX2Ti through BX4Bi and BX4Ti.

Since all the internal address signals BXaB and BXaT are fixed to the high level when the dynamic RAM is in the standby state, the signal outputted from each NAND gate circuit in the input unit is rendered low in level.

Since the input signal is rendered low in level, each NAND gate circuit, which constitute the decoder, fixes its output signal to a high level. Further, since a high level is supplied to the input of the preceding stage of each of two CMOS inverter circuits used for output, a signal outputted from the preceding stage is rendered low in level and a signal outputted from the subsequent stage thereof is rendered high in level.

Thus, the signal levels of the respective internal logic stages are fixed as described above in a non-operating state. Therefore, in order to reduce the subthreshold leakage current described above, the first-stage NAND gate circuits are electrically connected to the ground line VSS in turn according to a signal transfer direction to produce the low-level output signals, whereas the power sides thereof are electrically connected to the sub power line VCTX. Since the P channel MOSFETs QP1 and QP2 and the like shown in FIG. 1, which are connected to the power line VCC when being in the non-operating state, are turned off, the sub power line VCTX serves so as to reduce the subthreshold leakage current that flows through the turned-off P channel MOSFETs constituting each NAND gate circuits referred to above.

Since the P channel MOSFETs and N channel MOSFETs of each CMOS circuit, which constitute each logic stage referred to above, are operated at high speed as will be described later, the threshold voltages thereof are lowered. On the other hand, the switch MOSFETs QP1, QP2, etc., which constitute the power switch referred to above, are set so that their threshold voltages are relatively increased, to thereby substantially prevent the flow of the subthreshold leakage current at the time that they are off.

Second-stage NAND gate circuits are respectively electrically connected to the power line VCC to produce high-level output signals in response to the low-level input signals supplied from the outputs of the first-stage NAND gate circuits. However, the ground sides thereof are respectively electrically connected to the subground line VSTX. Since the N channel MOSFETs QN1, QN2 and the like shown in FIG. 1, which are electrically connected to the ground line VSS when they are in the non-operating state, are turned off, the subground line VSTX serves so as to reduce the subthreshold leakage current flowing through the turned-off N channel MOSFETs that constitute the NAND gate circuits. In a manner similar to the above, the switch MOSFETs QN1, QN2, etc., which constitute the power switch, are set so that their threshold voltages become great relatively. As a result, the subthreshold leakage current at the time that they are off, is substantially prevented from flowing.

Subsequently, each three-stage CMOS inverter circuit is activated by the VCTX and VSS in a manner similar to the first-stage NAND gate circuits. Each fourth-stage CMOS inverter circuit is activated by the VCC and VSTX in a manner similar to the second-stage NAND gate circuits. It is thus possible to reduce the subthreshold leakage current that flows when they are in a non-operating state.

Figure 5:
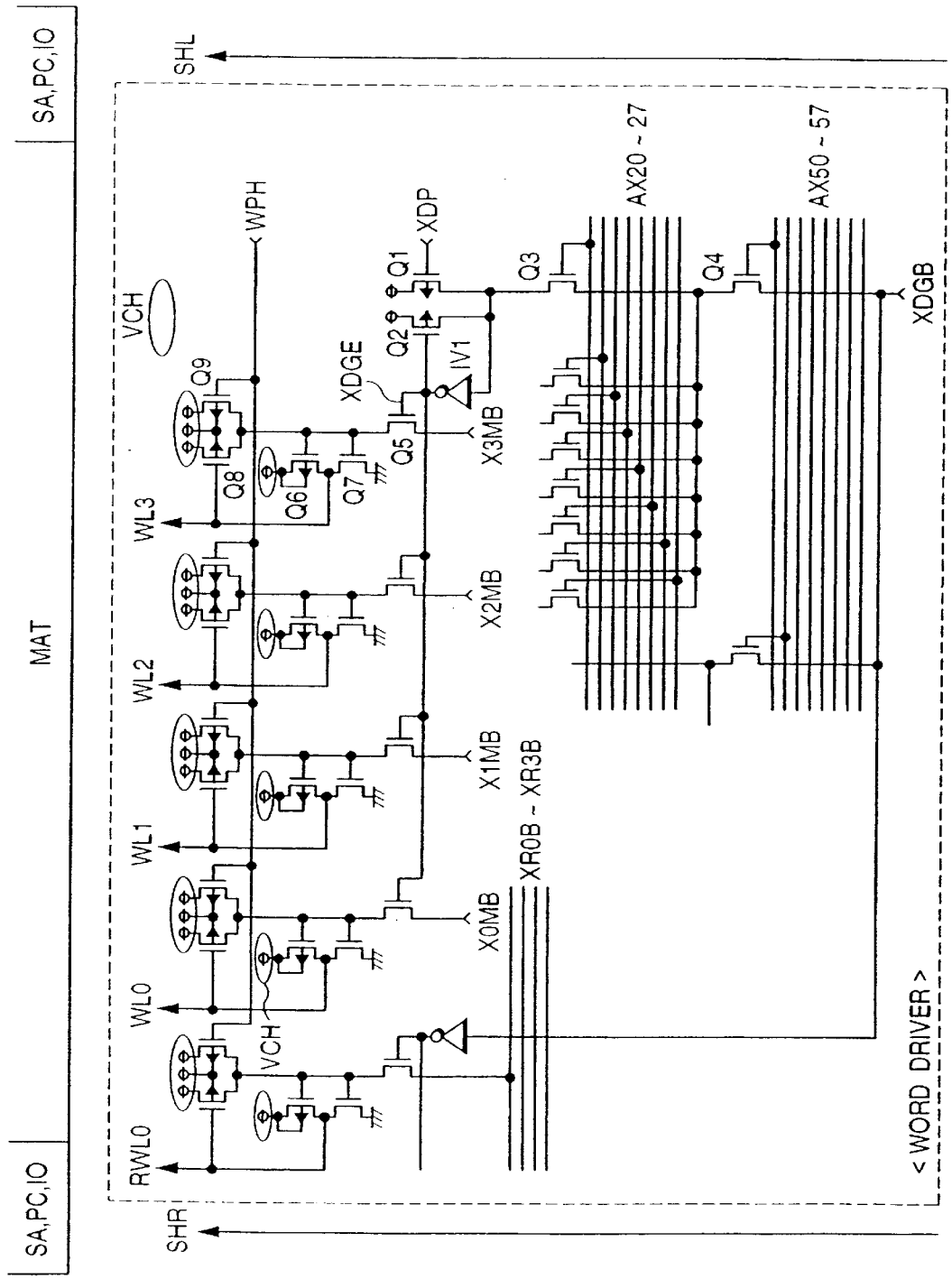
FIG. 5 is a circuit diagram specifically showing examples of an X decoder, and a latch circuit and a word driver connected thereto, which are employed in the dynamic RAM to which the present invention is applied.

FIG. 5 is a specific circuit diagram showing examples of the X decoder, a latch connected to the X decoder and a word driver. Although not restricted in particular, symbols AX20 through AX27 respectively indicate signals produced by predecoding address signals A2 through A4 composed of three bits with the above-described predecoder. Further, symbols AX50 through AX57 respectively indicate signals produced by predecoding address signals A5 through A7 composed of three bits with a predecoder similar to the above predecoder. Each MOSFET Q3 whose gate is supplied with one of the predecoded signals AX20 through AX27 and each MOSFET Q4 whose gate is supplied with one of the predecoded signals AX50 through AX57, are electrically directly connected to one another so as to constitute the X decoder, which is supplied with a select timing signal XDGB.

The X decoder is composed of a dynamic logic circuit. The X decoder is constructed so that a P channel precharge MOSFET Q1 switch-controlled by a precharge signal XDP and the MOSFETs Q3 and Q4 constituting each logic block are connected in series. Namely, a select/non-select decode signal is formed depending on whether or not a node precharged to a high level by the precharge MOSFET Q1 is discharged through the MOSFETs Q2, Q3 and Q4 in response to a low level of the timing signal XDGB.

The latch comprises an inverter IV1 and the P channel MOSFET Q2 provided between the input of the inverter IV1 and a power terminal VCC and controlled by a signal XDGE outputted from the inverter IV1. The MOSFET Q2 forms a positive feedback circuit in response to the non-select level corresponding to the low level. The MOSFET Q2 prevents a non-select word line from being selected by the inversion of the level at the above node due to the leakage current upon turning off of the MOSFETs Q3 and Q4.

Although not restricted in particular, the output signal XDGE of the inverter IV1 is of a select signal associated with four word lines WL0 through WL3. Of these four word lines WL0 through WL3, one word line is selected which is specified or designated by four word line select timing signals X0MB through X3MB produced by decoding address signals A0 and A1 of low-order bits and adding the select timing signal to them.

Namely, when the output signal XDGE of the latch is of a select level corresponding to a high level, a MOSFET Q5 is turned on. When the word line select timing signal X3MB is changed from a high to a low levels, a low-level input signal is supplied to a word driver composed of a P channel MOSFET Q6 and an N channel MOSFET Q7 activated by a booster or step-up voltage VCH and hence a word line WL3 connected to their output terminals is raised from the low level to a high level corresponding to the step-up voltage VCH.

When the output signal XDGE of the latch is of the select level corresponding to the high level, other MOSFETs are also turned on together with the MOSFET Q5. However, since the word line select timing signals X0MB through X2MB remain at the high level, the N channel MOSFET of the word driver is turned on so as to cause each of the word lines WL0 through WL2 to remain in a non-selected state indicative of a low level. A P channel MOSFET Q8 is used as a latch MOSFET placed in the non-select level. When the word line WL3 is in the non-select low level, the P channel MOSFET Q8 is turned on to thereby bring an input terminal of the word driver to the step-up voltage VCH so as to turn off the P channel MOSFET Q6. A P channel MOSFET Q9 is used as a precharge MOSFET. The P channel MOSFET Q9 is turned on in response to a low level of a precharge signal WPH so that the input terminal of the word driver is precharged to VCH.

When the output signal XDGE of the latch is of a non-select level corresponding to a low level, MOSFETs typified by the MOSFET Q5 are held off. Thus, even if either one of the word line select timing signals X0MB through X3MB is changed from the high to low levels, the P channel MOSFET Q8 is turned on in response to the low levels of the word lines WL0 through WL3 each associated with the precharge level without being responsive to its change. As a result, the latch that the high level corresponding to the VCH is fed back, is exerted on the input terminal of the word driver so that each of the word lines WL0 through WL3 or the like is maintained at the non-selected state.

Since the amplitude of the signal inputted to the word driver composed of, for example, the MOSFETs Q6 through Q9 operated by the step-up voltage VCH corresponding to the select level of each word line is increased as in the circuits employed in the present embodiment, the threshold voltage is relatively raised as in the power switches MOSFETs QP1, QN1, etc. Therefore, since the subthreshold leakage current at the turning off of the word driver can be substantially brought to naught, the MOSFETs are directly connected to the ground line VSS even in the sense of stabilization of the select/non-select level of each word line. However, since the inverter IV1 is reduced in signal amplitude in a manner similar to the predecoder and the input signal thereof may simply be fixed to a high level as compared with the precharge signal XDP upon non-selection of the word line so as to form or produce a low-level output, the inverter IV1 may be connected to the ground line VSS and the sub power line VCTA.

A word driver, a latch MOSFET and a precharge MOSFET similar to those referred to above are connected even to a redundant word line RWL0. The redundant word line RWL0 is selected in synchronism with the timing signal XDGB and a redundant word line select signal XR0B produced by a redundant circuit composed of an unillustrated fuse circuit for storage of defective addresses and an address comparator for comparing each defective address and an input X address. Since, at this time, the AX20 through A27 and AX50 through AX57 produced from the predecoder corresponding to a normal circuit or the word line select timing signals X0MB through X3MB are brought to the non-select level, based on a defective-address comparison coincidence signal, no defective word line is selected.

Although not restricted in particular, the memory array employed in the present embodiment is divided into a plurality of memory mats as will be described later. Sense amplifiers SA, precharge circuits PC and input/output lines are provided on both sides of each memory mat MAT. Although not restricted in particular, the sense amplifiers associated with odd-numbered complementary bit lines and even-numbered complementary bit lines are distributed to both sides to match the pitches of complementary bit lines disposed so as to intersect at right angles to the word lines WL0 through WL3 or the like with the pitches of the sense amplifier and the precharge circuit. Owing to the placement of such sense amplifiers SA, one sense amplifier can be placed at a pitch corresponding to twice the pitch of each of the complementary bit lines.

Although not restricted in particular in the present embodiment, each sense amplifier is set to a shared sense amplifier system. Signals SHL and SHR are of shared select signals. Although the left and right sides are reversed at one view in the same drawing, the memory mat in the same drawing is disposed on the left side as viewed from the right-side sense amplifier SA if the sense amplifier SA is considered as the center. Therefore, the select signal like SHL is supplied to the memory mat. Since the memory mat shown in the same drawing is disposed on the right side as viewed from the left-side sense amplifier SA, the select signal like SHR is supplied to the memory mat.

Figure 6:
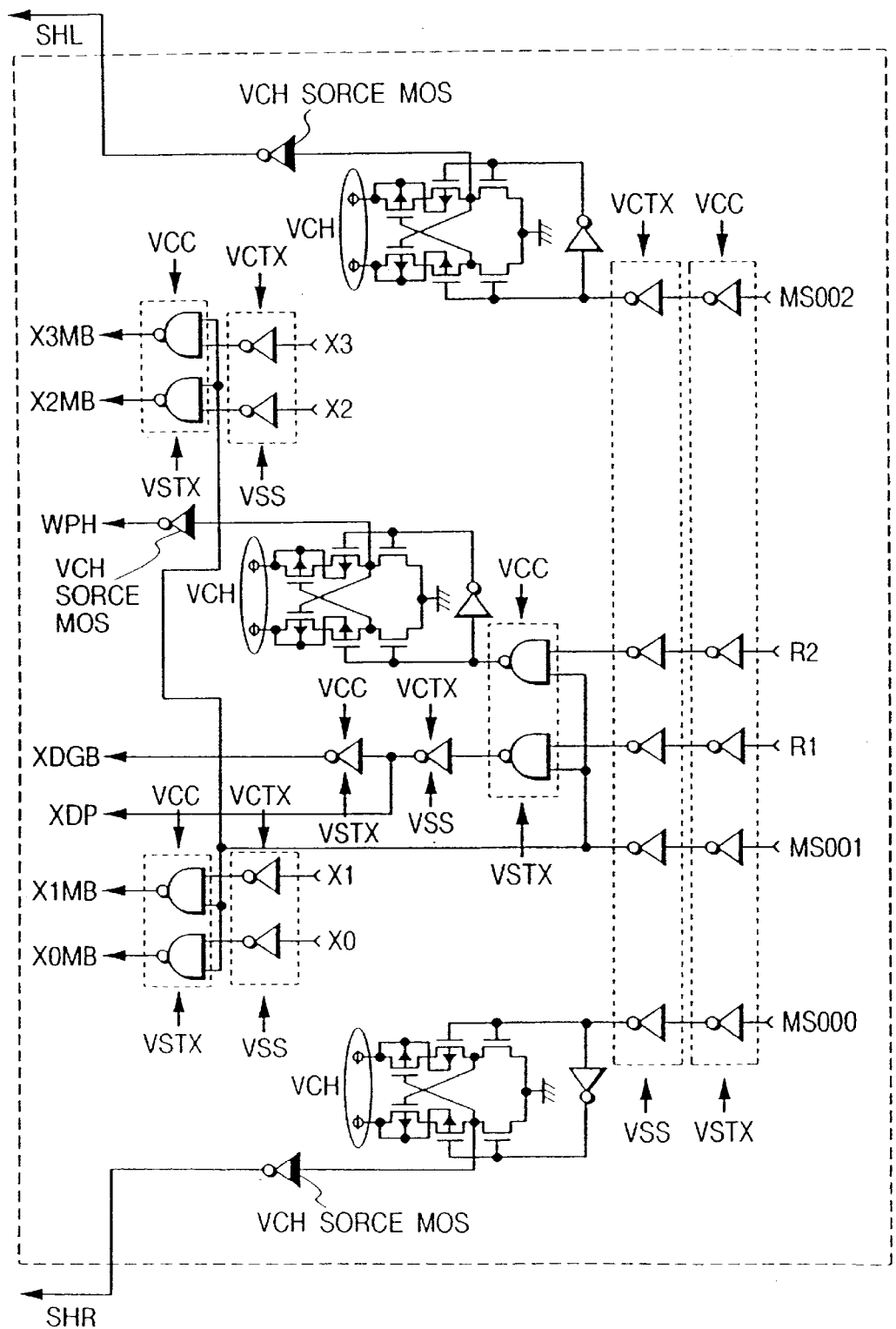
FIG. 6 is a circuit diagram illustrating one example of a mat control circuit employed in the dynamic RAM to which the present invention is applied.

FIG. 6 is a circuit diagram of one example of the mat control circuit. High-order address signals are decoded to produce or form mat select signals MS000, MS001 and MS002, for example. The memory mat MAT shown in FIG. 5 is selected by the mat select signal MS001. The mat select signal MS001 is supplied to four NAND gate circuits through two inverters connected in tandem. The four NAND gate circuits are respectively supplied with timing signals x0 through x3 obtained by combining the decode signals formed by decoding the address signals A0 and A1 with the word line select timing signals. Thus, the word line select timing signals X0MB through X3MB are produced from the outputs of the NAND gate circuits. This means that the predecode signals AX20 through AX27, AX50 through AX57 and the timing signals x0 through x3 are commonly used to the plurality of memory mats.

The precharge signals XDP and WPH and the operation timing signal XDGB of the row decoder are formed by combining the mat select signal MS001 with X-system timing signals R1 and R2. Since the precharge signal WPH is used as a signal supplied to the gate of each P channel MOSFET operated based on the step-up voltage VCH, the precharge signal WPH is converted into a level by a level converter circuit and the converted level signal is outputted through an inverter activated by the step-up voltage VCH. The mat select signals MS000 and MS002 each having the amplitude of such a signal as the source voltage VCC are by-level converted into signal amplitude corresponding to the step-up voltage VCH by the level converter circuit, whereby the shared select signals SHR and SHL are formed.

Even in the case of the mat control circuit, since the input signals R1 and R2 and MS001 through MS002 and the like are respectively fixed to a low level upon its non-operation as described above and are used to form high-level output signals, the mat control circuit is activated by the power line VCC and the subground line VCTX in the same manner as described above. Since second-stage CMOS inverter circuits are reversely supplied with high-level input signals to form low-level output signals, the second-stage CMOS inverter circuits are electrically connected to the sub power line VCTX and the ground line VSS. Subsequently, third-stage NAND gate circuits are activated by the power line VCC and the subground line VCTX in the same manner as described above. Since the signals x0 through x3 are fixed to a high level upon deactivation of the mat control circuit, the third-stage NAND gate circuits are activated correspondingly by the VCTX and VSS in accordance with the above-described method. Further, the NAND gate circuits supplied with the output signals thereof are activated by the VCC and VSTX.

Figure 7:
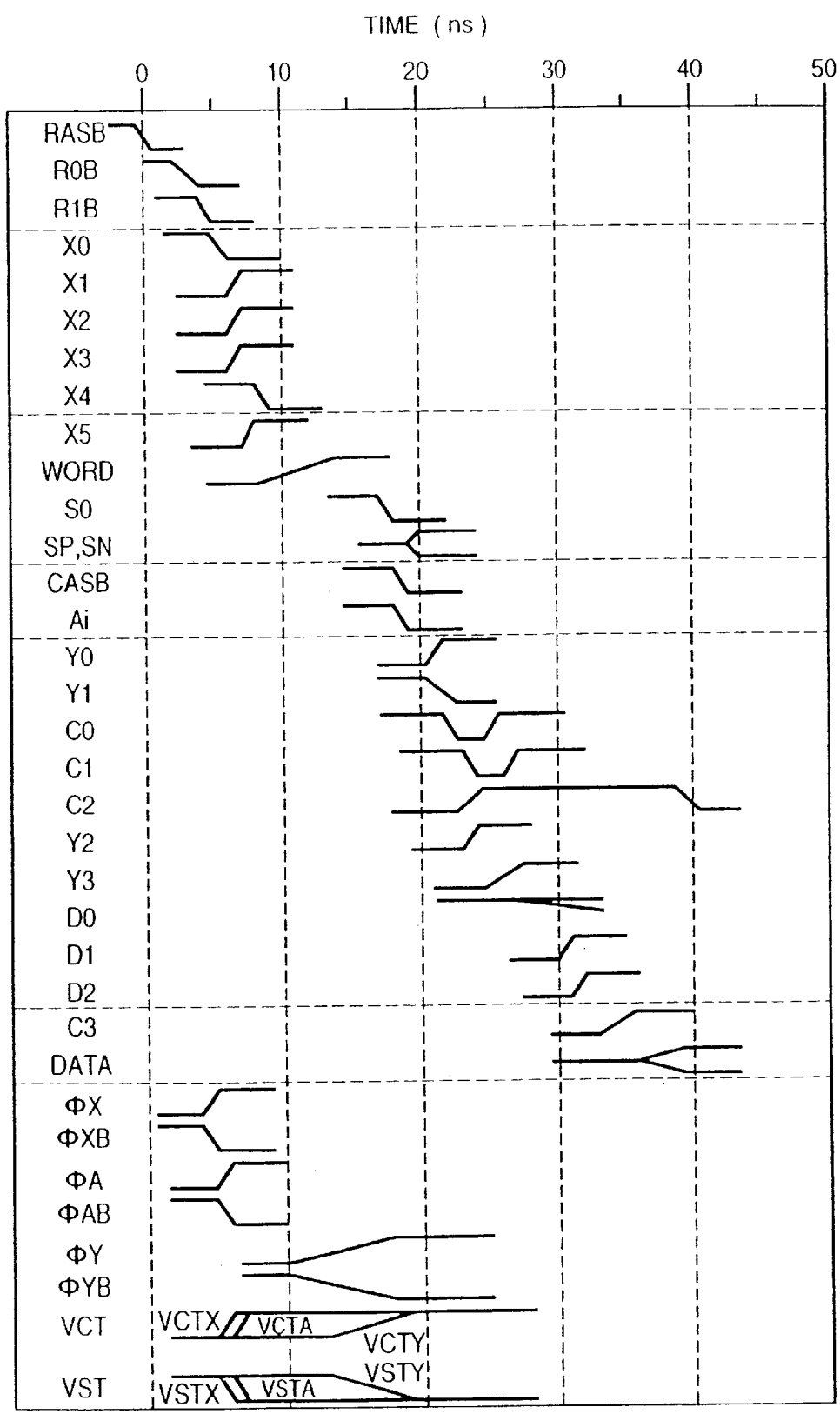
FIG. 7 is a timing chart for describing one example of the operation of the dynamic RAM to which the present invention is applied.

FIG. 7 is a timing chart for explaining one example of the operation of the dynamic RAM shown in FIGS. 1 and 2. The row address strobe signal RASB is changed from the high to low levels to start the memory access. When the output signal R0B of the RAS input buffer 1 is changed from a high to a low levels, the RAS clock generator 2 changes the typical row-system timing signal R1B from a high to a low levels in response to its change. With the change of the timing signal R1B to the low level, the address signal Ai inputted from the address buffer 3 is captured or loaded into the X address latch 4 as an X address signal.

With the change of the timing signal R0B to the low level, the control signal φX of the power switch is changed from the low to high levels and the control signal φXB is changed from the high to low levels. Thus, the supply of the source voltage VCC to the sub power line VCTX is started by the turning on of the switch MOSFET QP1 and the supply of the ground potential VSS to the subground line VSTX is started by the turning on of the switch MOSFET QN1. Namely, the supply of the voltages to the sub power line VCTX and the subground line VSTX is carried out simultaneously and concurrently with the operations of the RAS clock generator 2 and the X address latch 4.

Thus, when an internal address signal X0 is generated in association with the latch operation of the X address latch 4, at least the input-stage logic circuits of the respective circuits of the X predecoder 6, mat select circuit 7 and X address comparator 8 are substantially supplied with the source voltage VCC owing to the turning on of the switch MOSFET QP1. Further, the subground line VSTX is substantially supplied with the ground potential VSS owing to the turning on of the switch MOSFET QN1. Thus, signals responsive to the supplied voltages are formed without interfering with a substantial operation. In association with the transfer of the signals from the logic stages in the X predecoder 6 and the mat select circuit 7, potentials necessary for operation are successively supplied to the sub power line VCTX and the subground line VSTX by the switch MOSFETs stepwise-activated successively in their signal transfer directions, so that predecode signals Xl and X2 and a mat select signal X3 are formed.

The control signals φA and φAB are respectively changed to a high level and a low level with lags behind the control signals φX and φXB to thereby start the supply of the source voltage VCC to the sub power line VCTA for the array block and the supply of the ground potential VSS to the subground line VSTA for the array block. Since the timing provided to output the predecode signal Xl formed in the above-described X-system circuit and an output signal X4 of the mat control circuit 9 makes lead time, the sub power line VCTA and the subground line VSTA used for the array block are respectively set to desired potentials.

Thus, in the array block, one word line WORD is raised to the high level from the low level in response to a select signal X5 produced from the X decoder 12. Thereafter, the common source switch 16 is turned on in response to the change of a sense amplifier activation signal S0 to a low level to thereby respectively vary common sources SP and SN of each sense amplifier to a high level and a low level. As a result, a microsignal is read into its corresponding complementary bit lines of the memory array and thereafter the operation for amplification of the microsignal is started.

A column address strobe signal CASB is changed from a high to a low levels to capture a Y-system address signal. Namely, when the output signal of the CAS input buffer 18 is changed from a high to a low levels, the CAS clock generator 19 generates an address take-in or capturing timing signal in response to its change to thereby allow the Y address latch 20 to capture the address signal Ai inputted from the address input buffer 3 therein as a Y address signal.

The address signal Y1 taken in the Y address latch 20 is supplied to the Y predecoder 28 and the Y address comparator 29. An address signal Y0 is supplied to the address variation detector 25 from which an address variation detection signal C0 is generated. In response to the signal C0, the equalizing pulse generator 26 generates an equalize pulse C1 to equalize the input signal supplied to the input terminal of the main amplifier 30. In response to the signal C0 and the timing signal outputted from the CAS clock generator 19, the main amplifier control circuit 27 generates a main amplifier control signal C2.

Since the Y decoder 33 generates a Y select signal in response to a predecode signal Y2, a read signal D0 is transferred to the input terminal of the main amplifier 30 and a signal D1 obtained by amplifying the read signal D0 with the main amplifier 30 is transferred to the output buffer 37 through a data selector 35 as an input signal D2 therefor. The output buffer 37 is activated by a timing signal C3 outputted from the Dout buffer control circuit 36 to transmit output data DATA therefrom.

In a write mode, a write clock generator 21 judges or determines that a signal outputted from the write enable input buffer 23 is low in level. As a result, the write buffer 32 is activated so that data inputted from the data input buffer 24 is transferred to the complementary bit lines of the memory array, which are selected by the Y select signal.

The control signals φY and φYB associated with the Y-system and write circuit are respectively slowly varied to a high level and a low level in suitable timing in the course of the select operation of the X-system referred to above. Therefore, the switch MOSFETs QP5 and QN5 respectively connected to the sub power line VCTY and the subground line VSTY associated with the Y-system and write circuit are set so as to have desired current supply abilities with timing provided to start the operations of the respective circuits of the Y-system while currents outputted from the switch MOSFETs QP5 and QN5 are being increased slowly according to gentle changes in their gate voltages.

The sub power lines VCTX, VCTA and VCTY and subground lines VSTX, VSTA and VSTY, which are respectively divided into the three as described above, are respectively substantially brought into a floating state upon their non-operating states. In this condition, the control signals φX and φXB, φA and φAB, and φY and φYB are respectively successively generated with delays upon the memory access while the subthreshold leakage current produced in each logic circuit is being suppressed. Since the drive current required to vary the voltage applied to the gate of each of the switches MOSFETs respectively controlled based on the control signals φX and φXB, φA and φAB, and φY and φYB, and the supply current required to vary the voltages at the sub power lines VCTX, VCTA and VCTY and the subground lines VSTX, VSTA and VSTY to a desired voltage slowly increase in terms of the time, the occurrence of the peak current is suppressed and the influence of the currents on the operating speeds of the respective circuit blocks can be substantially avoided.

Figure 8:
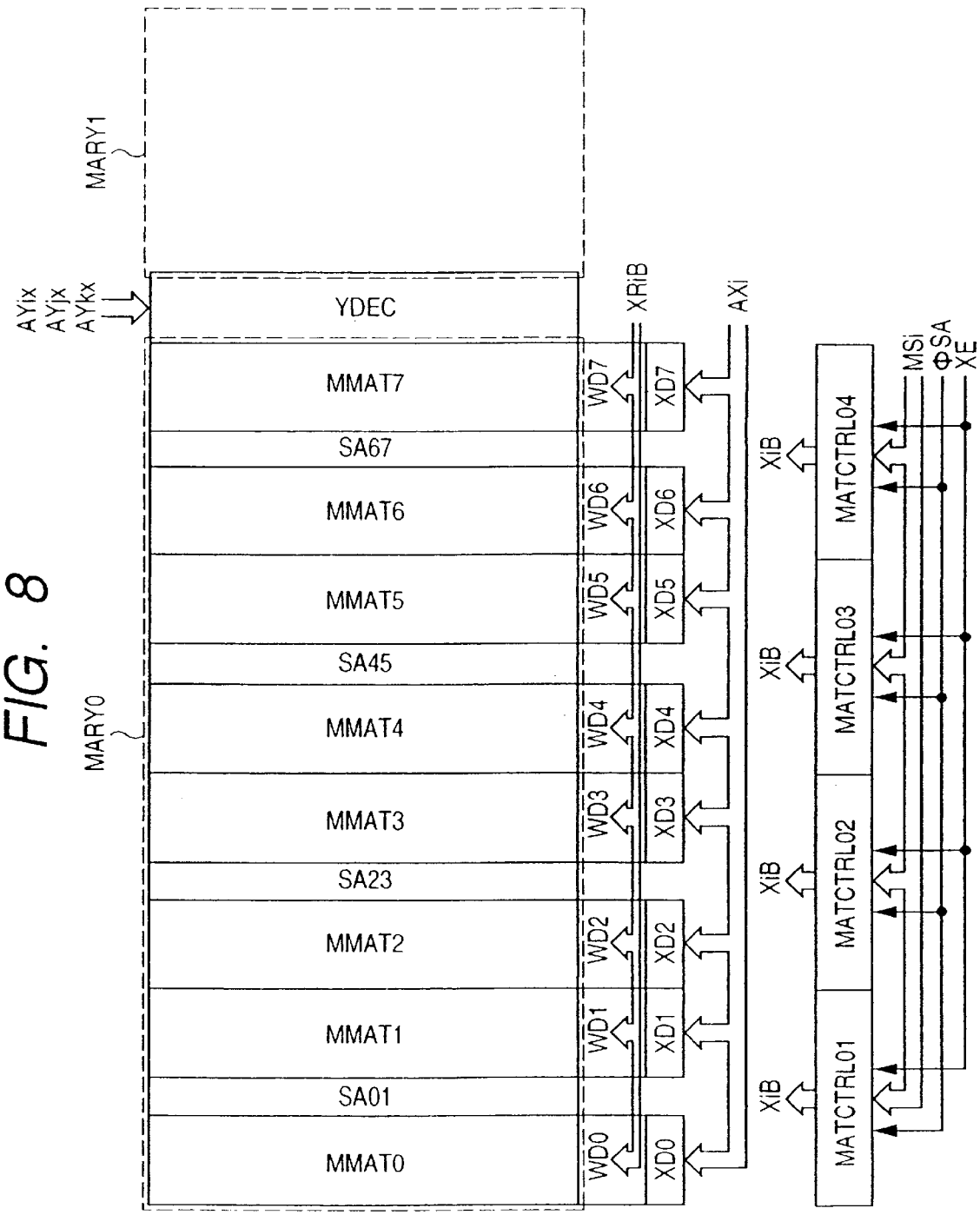
FIG. 8 is a block diagram showing examples of a memory array and its peripheral circuits employed in the dynamic RAM to which the present invention is applied.
Figure 9:
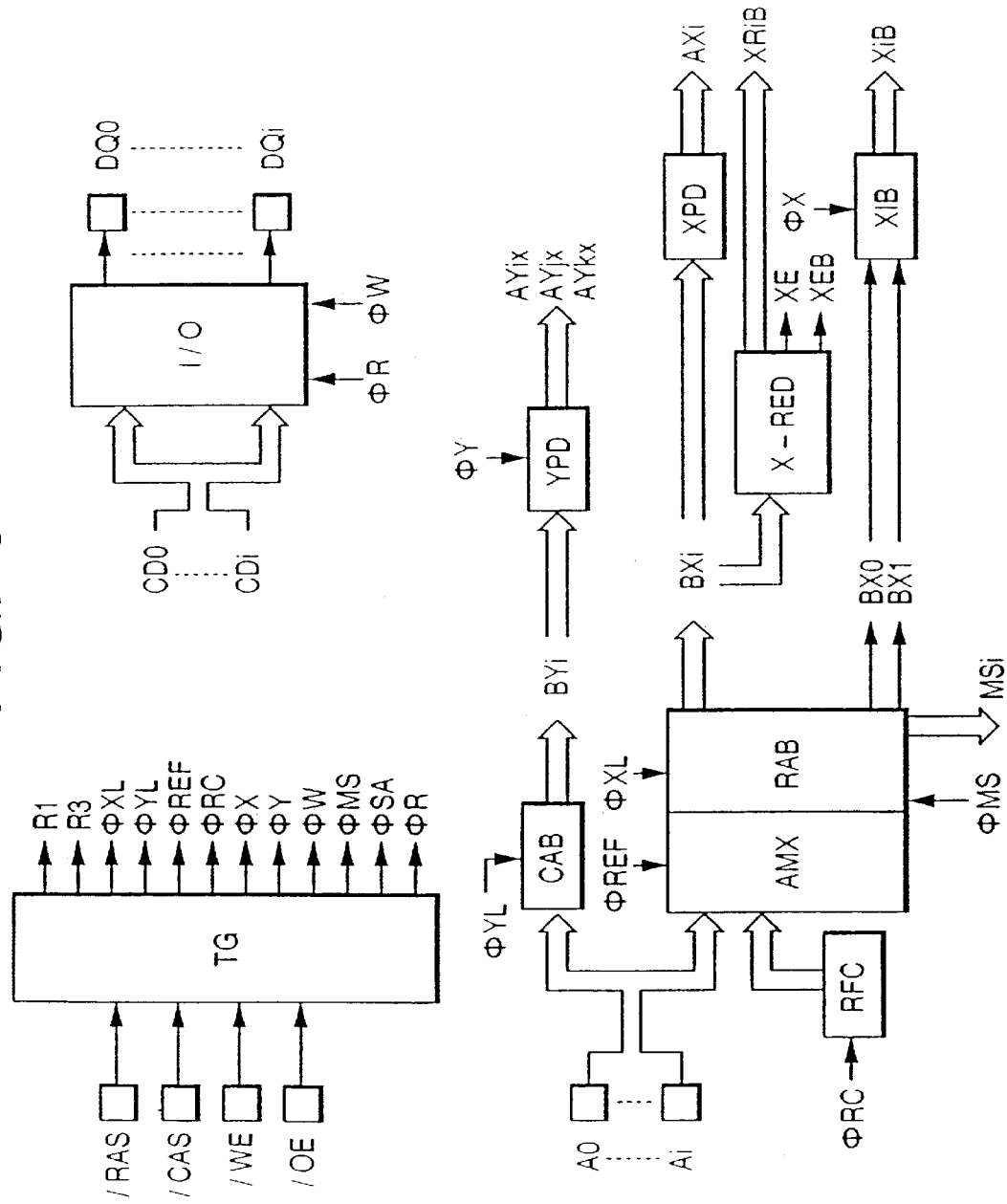
FIG. 9 is a block diagram depicting examples of an input/output interface and a timing control circuit employed in the dynamic RAM to which the present invention is applied.

FIGS. 8 and 9 are respectively block diagrams showing one embodiment of the dynamic RAM to which the present invention is applied. FIG. 8 shows a memory array and its peripheral selection circuits. FIG. 9 illustrates an input/output interface such as an address buffer, an input/output buffer or the like, and a timing control circuit.

Referring to FIG. 8, a sense amplifier SA01 is provided so as to be interposed between two memory mats MMAT0 and MMAT1. Namely, the sense amplifier SA01 serves as a shared sense amplifier used selectively for the two memory mats MMAT0 and MMAT1. An input/output portion of the sense amplifier SA01 is provided with an unillustrated select switch and electrically connected to complementary bit lines (or also called "complementary data lines or complementary digit lines") of the memory mat MMAT0 or MMAT1.

Other memory mats MMAT2 and MMAT3, MMAT4 and MMAT5 and MMAT6 and MMAT7 are respectively provided in pairs and provided with sense amplifiers SA23, SA45 and SA67 in common. A single memory array MARY0 is composed of a total of eight memory mats MMAT0 through MMAT7 and the four sense amplifiers SA01 through SA67 referred to above. A Y decoder YDEC is provided for the memory array MARY0. A memory array MARY1 is provided symmetrically with respect to the memory array MARY0 with the Y decoder YDEC interposed therebetween. Although an internal configuration of the memory array MARY1 is omitted, the memory array MARY1 is similar in configuration to the memory array MARY0.

Decoders XD0 through XD7 are provided with respect to the memory mats MMAT0 through MMAT7 respectively. These decoders XD0 through XD7 respectively decode a signal AXi outputted from a predecoder XPD to produce or form four word line select signals. Word drivers WD0 through WD7 for producing or forming word line select signals,. based on signals outputted from the decoders XD0 through XD7 and signals outputted from mat control circuits MATCTRL01 through MATCTRL67 to be next described are provided. Word drivers corresponding to spare or reserve word lines for defective relief are also included in the word drivers.

The mat control circuit MATCTRL01 is provided with respect to the pair of memory mats MMAT0 and MMAT1. Similarly, the mat control circuits MATCTRL23, MATCTRL45 and MATCTRL67 are respectively provided even with respect to other pairs of memory mats MMAT2 and MMAT3, MMAT4 and MMAT5, and MMAT6 and MMAT7. The mat control circuits MATCTRL01 through MATCTRL67 are activated in response to a mat select signal MSi, a signal XE, a sense operation timing signal $\phi$SA and signals obtained by decoding address signals of the two rightmost bits. Of these, one mat control circuit relative to the selected memory mat outputs a signal XiB or the like for selecting one of the four word lines.

Otherwise, each of the mat control circuits MATCTRL01 through MATCTRL67 outputs a select signal for holding ON a bit line select switch corresponding to either of the left and right memory mats in association with the selected memory mat referred to above and turning OFF bit line select switches associated with the non-selected memory mats, and a timing signal for starting the amplifying operation of each sense amplifier. Further, each of the mat control circuits has the function of controlling either one or both of each sense amplifier and each bit line select switch upon standby at a refresh operation to be described later to thereby bring each bit line into the floating state.

Since the output of the select signal XiB or the like is prohibited based on a low level of the signal XE when an access to a defective word line is performed, the operation for selecting the defective word line is stopped. On the other hand, since a select signal XRiB on the redundant circuit side is formed, the reserve word line is placed in a selected state.

Referring to FIG. 9, a timing control circuit TG determines an operation mode in response to a row address strobe signal /RAS, a column address strobe signal /CAS, a write enable signal /WE and an output enable signal /OE supplied from an external terminal, and correspondingly forms or produces various timing signals necessary for the operation of each internal circuit. In the same drawing, symbol / means that a low level is an active level.

Signals R1 and R3 are of row-system internal timing signals and are used for a row-system select operation to be described later. The timing signal $\phi$XL is used as a signal for capturing a row-system address and holding it and is supplied to a row address buffer RAB. Namely, the row address buffer RAB captures addresses inputted from address terminals A0 through Ai in response to the timing signal $\phi$XL and causes a latch to store the same therein.

The timing signal $\phi$YL is used as a signal for capturing column-system addresses and causing a latch to hold the same therein and is supplied to a column address buffer CAB. Namely, the column address buffer RAB takes in the addresses inputted from the address terminals A0 through Ai in response to the timing signal $\phi$YL and causes the latch to store them therein.

The signal $\phi$REF is of a signal generated upon a refresh mode and is supplied to a multiplexer AMX connected to an input portion of the row address buffer. The multiplexer AMX is controlled based on the signal $\phi$REF so as to select a refresh address signal formed by a refresh address counter RFC. The refresh address counter RFC counts a refresh stepping pulse $\phi$RC produced by the timing control circuit TG to thereby generate the refresh address signal. The present embodiment is constructed so as to have auto-refresh and self-refresh to be described later.

The timing signal $\phi$X is of a row or word line select timing signal and is supplied to a decoder XIB from which four word line select timing signals XiB are formed or produced based on the signals obtained by decoding the address signals of the two rightmost bits. The timing signal $\phi$Y is of a column select timing signal and is supplied to a column-system predecoder YPD from which column select signals AYix, AYjx and AYkx are outputted.

The timing signal $\phi$W is of a control signal for providing instructions for a write operation and the timing signal $\phi$R is of a control signal for providing instructions for a read operation. The timing signals $\phi$W and $\phi$R are supplied to an input/output circuit I/O. Upon the write operation, an input buffer included in the input/output circuit I/O is activated so that the output buffer is brought to an output high impedance. Upon the read operation on the other hand, the output buffer is activated to bring the input buffer to an output high impedance.

The timing signal $\phi$MS is of a signal for providing instructions for a mat select operation and is supplied to the row address buffer RAB. A mat select signal MSi is outputted in synchronism with this timing. The timing signal $\phi$SA is used as a signal for providing instructions for the operation of each sense amplifier. Based on the timing signal $\phi$SA, the timing signal $\phi$MS is also used to form control signals for a precharge end operation of complementary bit lines and a separate operation of bit lines on the non-selected memory mat side as well as to form an activation pulse for each sense amplifier.

In the present embodiment, a row-system redundant circuit X-RED is typically shown by way of illustrative example. Namely, the above circuit X-RED includes a memory circuit for storing each defective address therein and an address comparator. The stored defective address is compared with an internal address signal BXi outputted from the row address buffer RAB. If they do not coincide with each other, then the signal XE is brought to a high level and a signal XEB is brought to a low level to thereby make the operation of the normal circuit valid or effective. When the input internal address signal BXi coincides with the stored defective address, the signal XE is rendered low in level to prohibit the select operation of each defective word line in the normal circuit. Further, the signal XEB is rendered high in level to output the select signal XRiB for selecting one reserve word line.

Although omitted in FIG. 9, a circuit similar to the row-system circuit is provided even within a column system. When a memory access to a defective bit line is detected by the circuit, the operation for the selection of the defective bit line by a column decoder YD is stopped and instead a signal for selecting each of bit lines provided as spares is formed.

Figure 10:
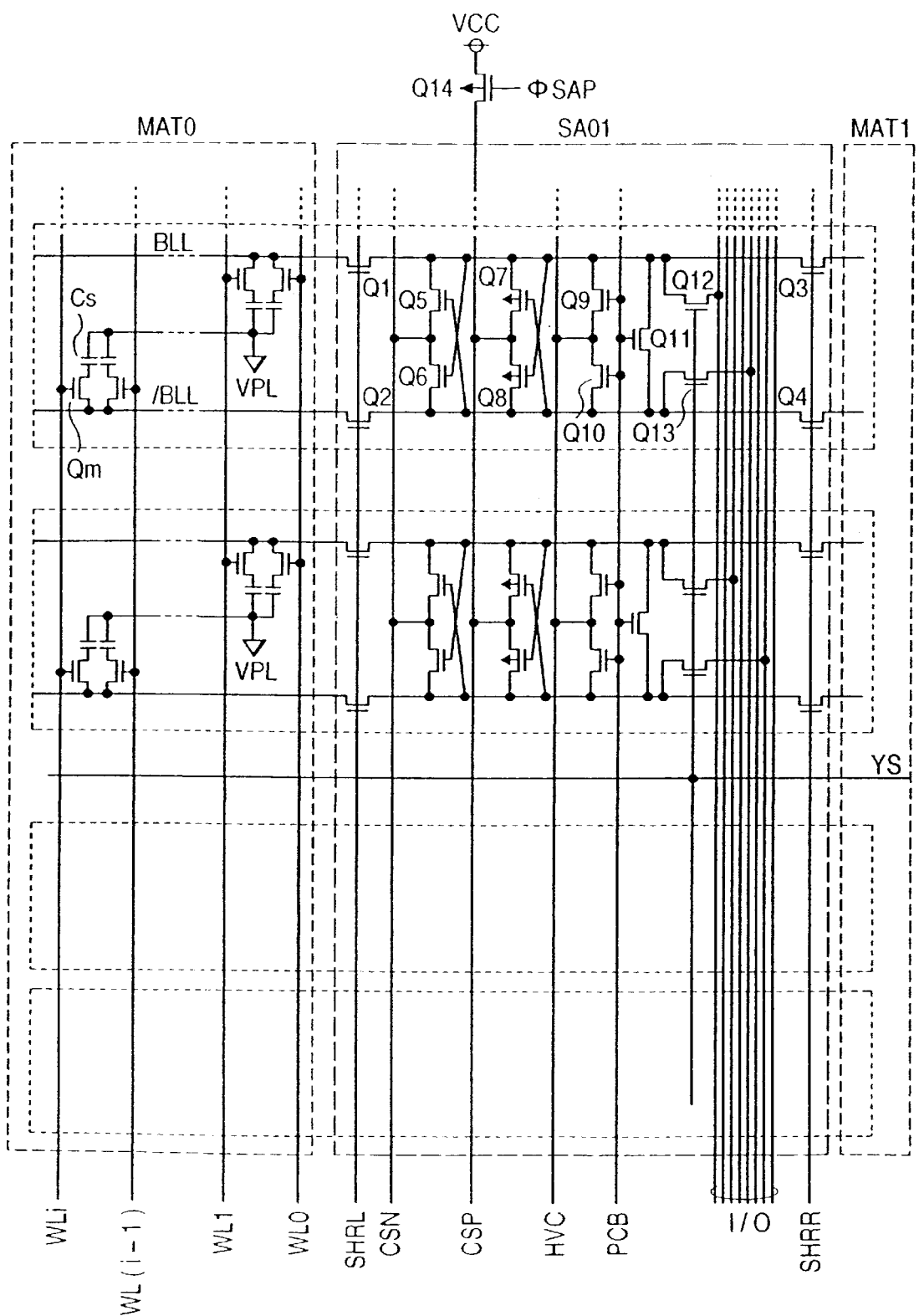
FIG. 10 is a fragmentary circuit diagram showing one example of a memory array employed in the dynamic RAM according to the present invention.

FIG. 10 is a fragmentary circuit diagram showing one example of the memory array employed in the dynamic RAM according to the present invention. In the same drawing, four word lines and two pairs of complementary bit lines in the memory mat MMAT0, a sense amplifier related to these, a precharge circuit, etc. are typically illustrated by way of example. The memory mat MMAT1 is shown as a black box. Circuit symbols are typically added to MOSFETs that constitute individual circuits associated with a pair of complementary bit lines BLL and /BLL.

A dynamic memory cell comprises address selection MOSFETs Qm and information storage capacitors Cs. The gate of one address selection MOSFET Qm is electrically connected to a word line WLi. The drain of the MOSFET Qm is electrically connected to the bit line /BLL and the information storage capacitor Cs is electrically connected to the source thereof. Other electrodes of the information storage capacitors Cs are commonly used and are supplied with a plate voltage VPL.

The pair of bit lines BLL and /BLL is disposed in parallel as shown in the same drawing and suitably intersect as needed to strike a capacity balance between the bit lines, for example. The complementary bit lines BLL and /BLL are electrically connected to an input/output node of each sense amplifier by switches MOSFETs Q1 and Q2. The sense amplifier is composed of N channel MOSFETs Q5 and Q6 whose gates and drains are cross-connected and provided in latch form and P channel MOSFETs Q7 and Q8 whose gates and drains are cross-connected and provided in latch form. The sources of the N channel MOSFETs Q5 and Q6 are electrically connected to a common source line CSN. The sources of the P channel MOSFETs Q7 and Q8 are electrically connected to a common source line CSP. A power switch MOSFET Q14 for the P channel MOSFETs is connected to the common source line CSP as shown by way of illustrative example. When a timing signal φSAP is rendered low in level, the MOSFET Q14 is turned on so as to supply a voltage required to activate each sense amplifier. An unillustrated N channel MOSFET is connected to the common source line CSN associated with the N channel MOSFETs Q5 and Q6 so as to supply a circuit ground potential for providing line operation timing.

A precharge circuit composed of a MOSFET Q11 for short-circuiting the complementary bit lines and switches MOSFETs Q9 and Q10 for supplying a half precharge voltage HVC to the corresponding complementary bit lines is connected to the input/output node of each sense amplifier. The gates of the MOSFETs Q9 through Q11 are commonly supplied with a precharge signal PCB. MOSFETs Q12 and Q13 form a column switch switch-controlled in response to a column select signal YS. In the present embodiment, four pairs of bit lines can be selected by one column select signal YS. Therefore, the column select signal YS is supplied commonly to the gates of switch MOSFETs constituting column switches connected to input/output nodes of four sense amplifiers associated with the two pairs of bit lines illustratively shown in the same drawing and the remaining unillustrated two pairs of bit lines. The four pairs of bit lines and the four pairs of input/output lines I/O are respectively connected to one another through the switch MOSFETs.

Figure 11:
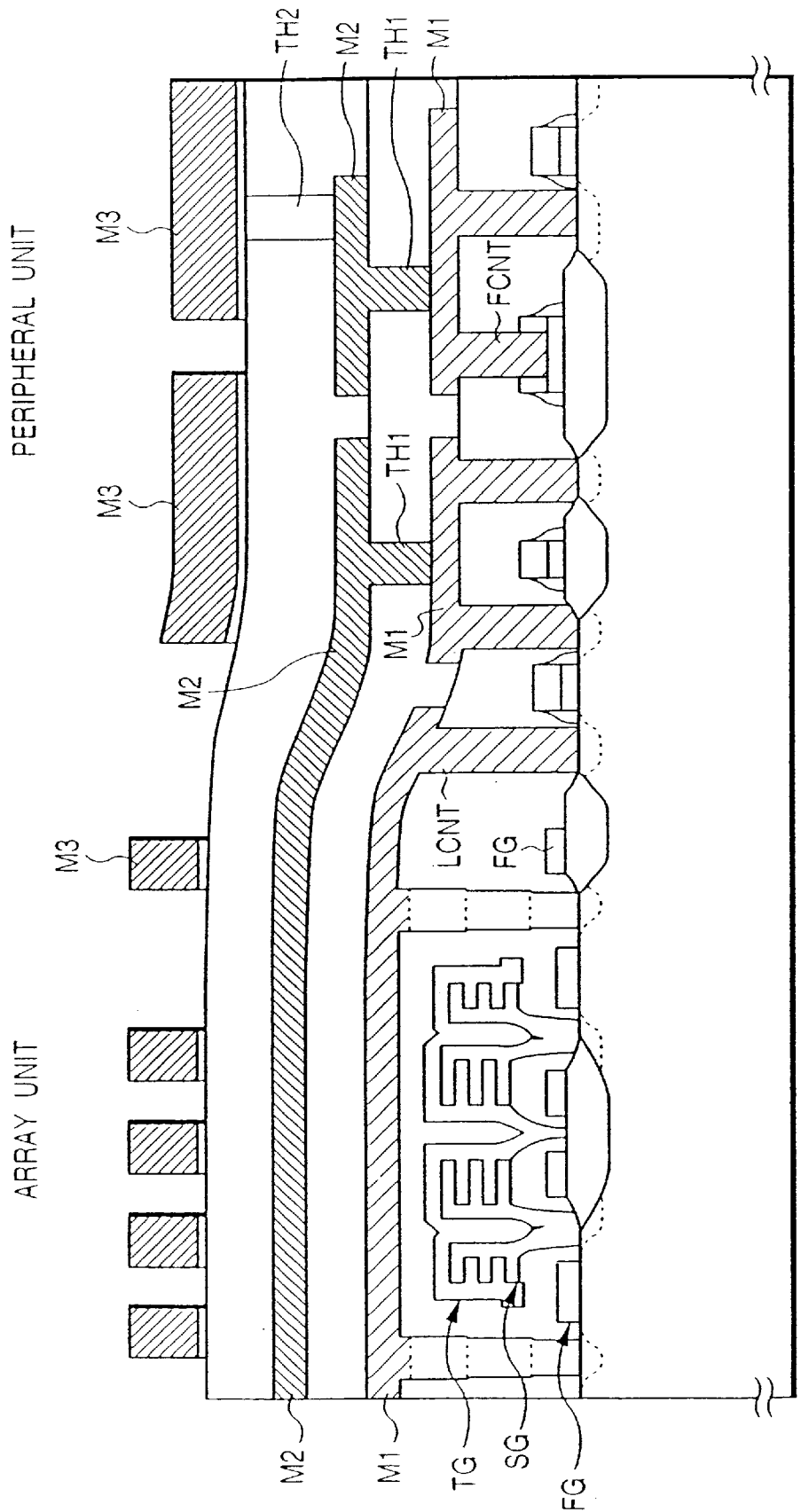
FIG. 11 is a cross-sectional view showing, as one example, a device structure for describing the dynamic RAM according to the present invention.

FIG. 11 is a cross-sectional view showing, as one embodiment, a device structure for describing the dynamic RAM according to the present invention. In the present embodiment, a device structure for the memory array and the peripheral portion referred to above is shown as a typical one by way of illustrative examples In regard to the storage capacitor of each memory cell, a polysilicon layer SG corresponding to a second layer is used as a storage node and is electrically connected to the source and drain of one of address selection MOSFETs. The polysilicon layer is shaped as a fin structure and is formed by a plate electrode composed of a polysilicon layer TG corresponding to a third layer with a thin gate insulating film interposed between the two layers. The gate of each address selection MOSFET is composed of a polysilicon layer FG corresponding to a first layer. Other source and drain of each address selection MOSFET are electrically connected to a metal interconnection or wiring layer M1 corresponding to a first layer, such as aluminum or the like with the FG, SG and TG interposed therebetween. Each bit line is formed of the interconnection layer M1.

The peripheral portion is formed with two N channel MOSFETs. The metal wiring layer M1 is electrically connected to the source and drain of each MOSFET by a contact LCNT. Alternatively, the metal wiring layer M1 is electrically connected to the polysilicon layer FG by a contact FCNT. The above-described metal wiring layer M1 and wiring layer M2 are electrically connected to each other through a first through-hole TH1, and the wiring layer M2 and a wiring layer M3 corresponding to a third layer are electrically connected to each other through a second through-hole TH2. When an input signal is supplied to the gate electrode of the MOSFET through the wiring layer M2, the input signal is taken in the wiring layer M1 used as a dummy through the first through-hole TH1 as described above and hence the input signal is introduced into. the polysilicon layer FG used as the gate electrode through the wiring layer M1 and the contact LCNT.

The wiring layer M3 for supplying the input signal is electrically connected to the wiring layer M2 through the second through-hole TH2. When an output signal is supplied to the next-stage circuit, for example, the wiring layer M1 is electrically connected to the wiring layer M2 used as a dummy through the first through-hole TH1. Thus, the output signal is introduced into the wiring layer M3 through the second through-hole TH2 with the wiring layer M2 interposed between the wiring layers M1 and M3.

Since the complementary bit lines are half-precharged in the non-operating state, a half precharge voltage is applied between the gate and source of each MOSFET as a reverse bias. Therefore, no subthreshold leakage current occurs in each address selection MOSFET. It is however considered that when each word line becomes a non-selection low level and the complementary bit lines are brought to VSS by the amplifying operation of each sense amplifier, the information charge stored at the high level loses or disappears due to the subthreshold leakage current.

If the subthreshold leakage current at such an address selection MOSFET turns into a problem, then a channel length is made long and a threshold voltage is increased. Alternatively, well regions in which memory cells each composed of the address selection MOSFETs are formed, are separated from each other and a negative substrate back bias voltage is supplied to each well region to increase an effective threshold voltage. In order to separate only the well regions for forming the memory cells from each other and supply the substrate back bias voltage thereto, a semiconductor substrate is shaped in the known triple well structure. Namely, each of the N channel MOSFETs, which constitute the peripheral circuits such as the decoder, etc., needs to have the low threshold voltage as described above in order to increase the operating speed thereof. Each well region in which the N channel MOSFET is formed, is biased to the circuit ground potential VSS.

When a large circuit block is provided with a set of a sub power line and a subground line alone, it is necessary to provide switch MOSFETs whose gate widths are large and reduce an on resistance of each switch MOSFET so as to provide the supply of current to the circuit block. This is because when a voltage drop occurs in the sub power line, the threshold voltage of each of P channel MOSFETs constituting the same circuit block increases equivalently and the lowering of speedup by the use of each MOSFET whose threshold voltage is low, is canceled due to its increase. Similarly, this will happen even in the case of the relationship between the threshold voltage of each N channel MOSFET and the on resistance of each MOSFET connected to the subground line.

It is thus necessary to reduce a voltage drop of the order of several tens of mV at maximum with respect to the average operating current of the same circuit block with a view toward keeping the effect of speeding up its operation. In the dynamic RAM according to the previous embodiment, for example, switch MOSFETs each having gate widths ranging from 5000 μm to 20000 μm are needed. It is thus necessary to charge or discharge the capacitor of the gate large in width when each switch MOSFET is turned on.

It is desirable that the sub power line and the subground line are used in a number of circuit blocks wherever practicable to reduce current consumption at the time of the non-operation as the entire circuit. To cope with it, it is however necessary to turn on the above-described power switch MOSFET in timing provided as quickly as possible after the inputting of RASB. For example, the sum of the gate widths of the MOSFETs connected to the power line VCC and the ground line VSS at the input unit becomes about 10000 μm, whereas the sum of the gate widths of the MOSFETs connected to the sub power line and the subground line at the X predecoder and the mat select circuit reaches about 15000 μm. Thus, whether or not the sub power line and the subground line should be connected to the X predecoder and the mat select circuit, depends on the change of the leakage current at the non-operation (deactivation) to the half the leakage current. It is thus important that each switch MOSFET is turned on before the X predecoder and the mat select circuit are started (before and after 5 n seconds after the inputting of RASB, for example).

Since it is necessary to charge or discharge the gate capacitor referred to above in a short time, the sub power line and the subground line are provided in pair as the entire circuit and the P channel switch MOSFET and the N channel switch MOSFET are respectively provided by one. In doing so however, a large peak current, which falls within a range of 0.5 A to 1.0 A, will flow when such switches MOSFETs are turned on. When such a large peak current is superimposed on the operating current flowing in each internal circuit, a large problem arises in terms of long-term reliability due to disconnection or the like caused by noise or a concentrated current.

As described above in the present embodiment, the concentration of current on each switch MOSFET at the time of its switch control is dispersed on a time basis by dividing the sub power lines and the subground lines into the three portions as a whole as described above and by making a difference between the timing provided to start each MOSFET and the timing provided to operate each of the switches MOSFETs divided in plural form, so as to stepwise activate each switch MOSFET. However, the peak current can be also controlled by simply collectively utilizing the sub power lines and the subground lines in common in the form of several blocks, providing the switch MOSFETs in plural form and setting the difference between the start timings. In this case, the layout of the sub power lines and the subground lines becomes easy as compared with the case in which the sub power lines and the subground liens are divided into pieces between the blocks. Further, since the sub power lines and the subground lines also increase in parasitic capacity, an advantage is obtained that variations in the voltages respectively applied to the sub power lines and the subground lines are reduced due to the occurrence of an instantaneous large current.

Figure 12:
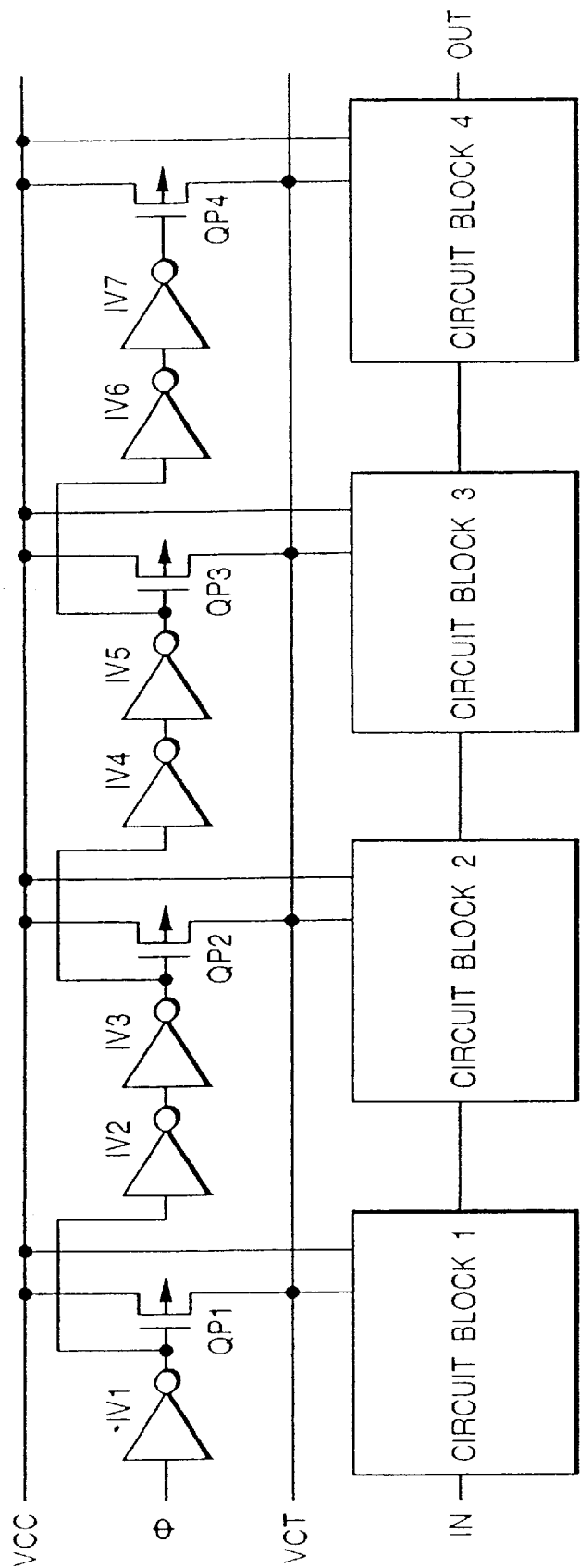
FIG. 12 is a block diagram for describing one embodiment of a semiconductor integrated circuit device according to the present invention.

FIG. 12 is a block diagram for describing one embodiment of the present invention. A power line VCC and a sub power line VCT, switch MOSFETS associated therewith, inverters, which constitute delay circuits for forming signals for controlling the MOSFETS, and circuit blocks supplied-with operating voltages from the inverters, are shown in the same drawing. Subground lines and a ground line for the respective circuit blocks employed in the present embodiment and switch MOSFETs associated therewith are omitted because they are similar to those on the source voltage VCC side.

In the present embodiment, the switch MOSFETs such as MOSFETs QP1 through QP4 for connecting the sub power line VCT and the power line VCC to one another are respectively provided so as to correspond to circuit blocks 1 through 4. The sum of gate widths of the individual switch MOSFETs QP1 through QP4 is set to such a value as to fall within a range in which the allowable voltage of the sub power line VCT varies due to the on resistance of each switch MOSFET referred to above. A control signal φ supplied to the gates of the switch MOSFETs QP1 through QP4 is transferred to each of inverters IV1 through IV7 as a signal delayed in turn by each of inverters IV1 through IV7 in order of transferring it to each of the circuit blocks 1 through 4 in turn.

Thus, when the sub power line VCT is shared between the plurality of circuit blocks 1 through 4, the X-system circuit, the array block and the Y-system and write circuit are respectively associated with the circuit blocks in the above-described dynamic RAM, for example. In the present embodiment, the circuit block 1 is supplied with an operating voltage from the switch MOSFET QP1 so as to perform a logic operation in response to an input signal IN. At this time, the voltage VCC supplied from the MOSFET QP1 is not sufficiently delivered or transferred to the circuit blocks far away from the input signal side as in the case of other circuit blocks 2 through 4 due to the distributed resistance of the sub power line VCT. However, since these circuit blocks perform significant circuit operations in response to signals outputted from the preceding-stage circuit blocks, a substantial problem does not occur. Namely, when the significant output signal corresponding to the input signal IN is transferred to the next-stage circuit block 2, the switch MOSFET QP2 is turned on so that the voltage VCC for performing a logic operation associated with it is supplied to the circuit block 2. Thus, since the delay in signal at each logic stage and the supply of the voltage to the sub power line VCT are carried out substantially in synchronism with each other, a substantial delay in operating speed does not occur.

The signal delay time developed in each logic circuit does not necessarily coincide with the operation of each switch MOSFET referred to above. This is because since a delay in supplying the power delays the operation for outputting a high level in response to its delay, a substantial logic output is actually formed dependent on the voltage of the sub power line VCT, which is supplied from each switch MOSFET. Thus, since the operating speed of each logic circuit becomes slow when the control on each switch MOSFET is extremely delayed, the difference in time between the respective switch MOSFETs is set so that the peak current referred to above falls below the allowance value and the voltage is stepwise supplied to the power line.

Figure 13:
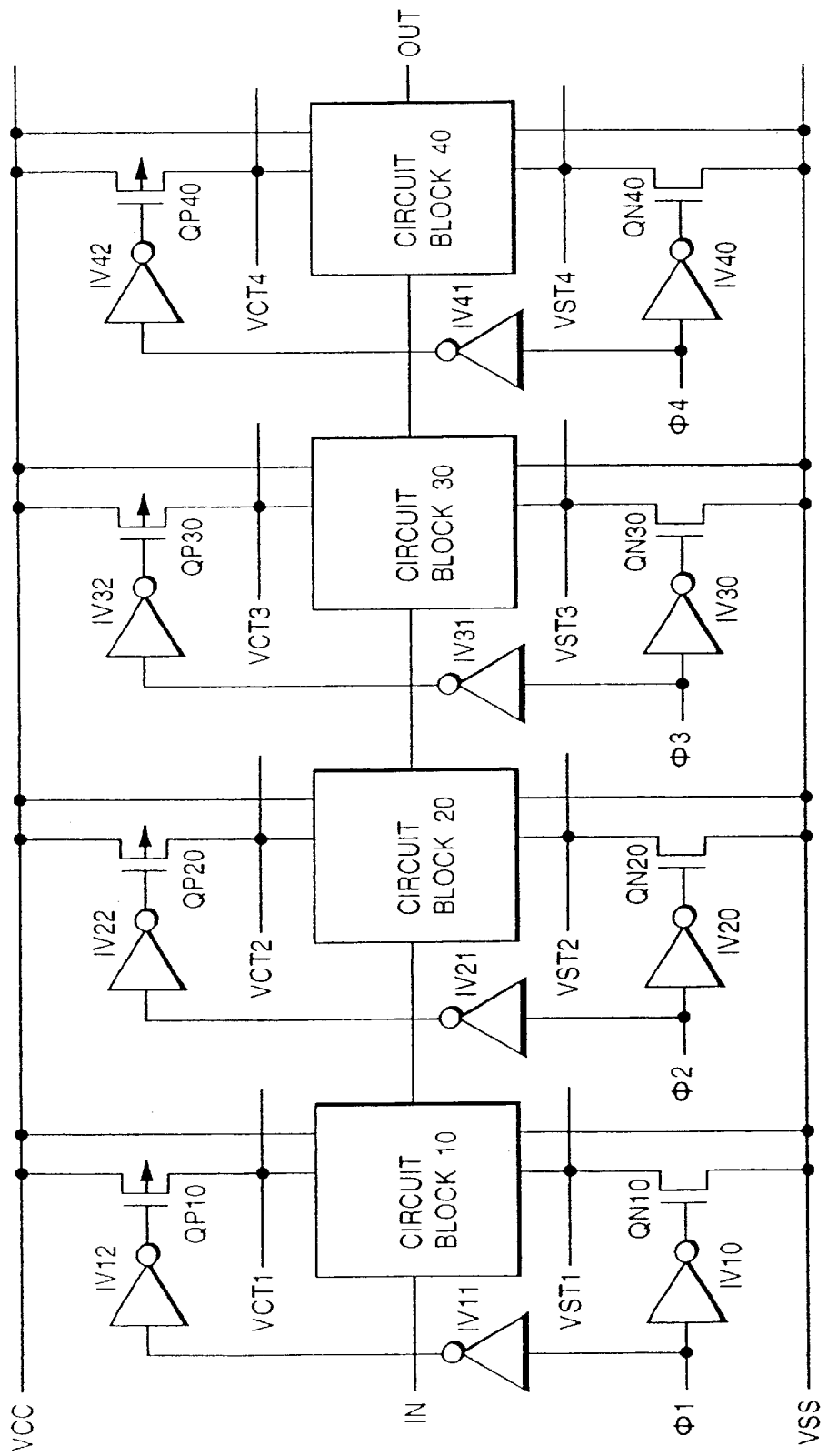
FIG. 13 is a block diagram for explaining another embodiment of the semiconductor integrated circuit device according to the present invention.

FIG. 13 is a block diagram for explaining another embodiment of the present invention. The same drawing shows an example in which a sub power line and a subground line are respectively divided into plural forms every circuit blocks. In the present example, the gate width of each switch MOSFET, which is determined by each of the values of allowable voltages of each sub power line and each subground line, which varies due to an on resistance of each switch MOSFET, can be reduced as compared with the case in which the sub power line is shared between the circuit blocks.

As a result, charge and discharge currents, which flow through the gates of the respective switch MOSFETs QP10 through QP40 or the like, are reduced. Further, a peak current can be reduced by starting the switch MOSFETs in turn with the passage of time, using the pair of sub power line and subground line for each circuit block activated substantially in the same timing. At the same time, the startup of each switch MOSFET can be speeded up because the gate width of each switch MOSFET is small as compared with the case in which the sub power line is not divided into the plural forms. When the circuit blocks free of execution of their circuit operations exist as in the Y-system and the write circuit at the refresh operation in the dynamic RAM, their corresponding switch MOSFETs can remain held in an off state and hence circuit's current consumption can be reduced.

Figure 14:
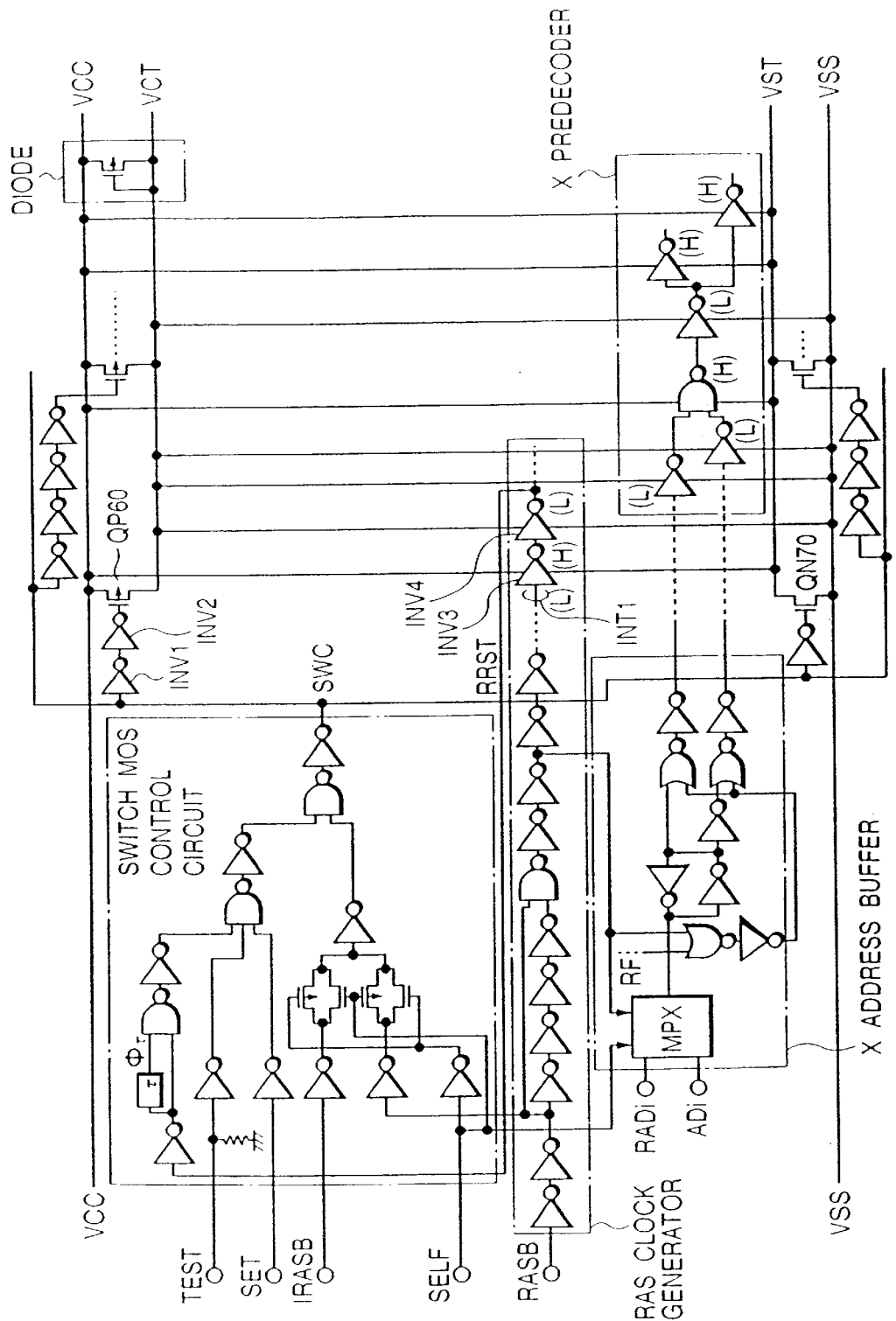
FIG. 14 is a circuit diagram showing one example of an X-system input unit employed in the dynamic RAM according to the present invention.

FIG. 14 is a circuit diagram showing one example of an X-system input portion or unit employed in the dynamic RAM according to the present invention. A switch MOS control unit or circuit which has been omitted in the above-described embodiment and an X-system input portion associated with it are shown in the same drawing in combination.

The switch MOS control unit forms or produces a signal SWC for starting a switch MOSFET in response to a clock signal generated at the earliest timing in response to an input signal of RASB. Thus, a first stage of a RAS clock generator, an X address buffer and the switch MOS control unit activated before each switch MOSFET is turned on, are not connected to the sub power line and the subground line. An X predecoder and the subsequent stage of the RAS clock generator are electrically connected to the sub power line VCT and the subground line VST. Gates and inverters at which output signals at the time of deactivation are low (L) in level, are electrically connected to the sub power line VCT. Gates and inverters at which output signals are high (H) in level, are electrically connected to the subground line VST as described above. Thus, each switch MOSFET is turned off upon deactivation to reduce a subthreshold leakage current developed in such gates and inverters, whereby a current consumed during standby is reduced.

Since the switch MOSFETs are parallel-connected in plural form and their gates are supplied with delayed signals, the switch MOSFETs are successively turned in domino or stepwise form. While suppressing their driving and a peak current produced due to their turning-on, the sub power line VCT and the subground line VST are supplied with their corresponding VCC and VSS voltages, A signal SET inputted to the switch MOS control circuit is an initialization signal, which is used to generate the switch MOS start signal SWC upon turning on of the power in the circuit and turn on each switch MOSFET so as to increase the voltage on the sub power line VCT. A signal TEST is of a test signal, which is used to generate a start signal from the outside for thereby forcibly turning on each switch MOSFET. The signal TEST is pulled down to ground through the resistance of its input node and is normally fixed to a low level.

Even if the RASB is brought to the high level, each switch MOSFET is turned off by a signal $\phi\tau$ produced by delaying a RAS reset signal by a time $\tau$ (~5 n seconds) so as to avoid the immediate turning off of the switch MOSFET. This is because since the circuit is precharged after the RASB has been brought to the high level, each switch MOSFET is held on during that time.

When the dynamic RAM enters into a self-refresh mode (CBR refresh), a self-refresh signal SELF is generated with timing A in response to the input of CBR (CAS before RAS) as shown in a timing chart in FIG. 15. In order to turn off the switch MOSFET except for the case where the dynamic RAM is actually performing a refresh operation in the self-refresh mode, to thereby reduce the subthreshold leakage current, the switch MOSFET can be controlled even by an internal signal IRASB.

If the refresh operation is set to concentrated refresh for concentratedly performing refresh on all the memory cells and thereafter bringing them into a deactivated state until the next refresh, which is rather than set to distributed refresh for uniformly dispersing and performing one cyclic operation required to refresh all the memory cells once, within its holding time, then the number of times that the switch MOSFET is controlled, can be reduced. A multiplexer MPX provided within the X address buffer selects an address signal ADi or a refresh address signal RADi inputted from the external terminal in association with the refresh control signal SELF and takes it therein.

The SET signal is used to generate the start signal SWC for each switch MOSFET upon turning on the power in the circuit and turn on the switch MOSFET so as to raise the voltage applied to the sub power line VCT. As an alternative to the signal SET, this processing may be performed by a MOSFET diode-connected between the power line VCC and the sub power line VCT. In this case, it is unnecessary to turn on the switch MOSFET upon power-up. If each of nodes in internal circuits at power-up is set to a potential at deactivation by the SET signal, then the supply of current to each of the internal circuits at power-up is all made by the power line VCC but not performed by the sub power line VCT. Therefore, the voltage of the sub power line VCT can be raised even by a diode having a low current supply ability.

Since the internal circuit is placed in an activated state when each switch MOSFET is in an on state upon power-up, the subthreshold leakage current flows. Since the potential on the sub power line VCT does not increase to VCC when the above-described diode is used, it is possible to prevent the subthreshold leakage current from occurring. A further effect can be obtained when MOSFETs supplied with a substrate bias by using a substrate back bias voltage generator, are used. In the MOSFETs to which the substrate bias is applied, the threshold voltage of each MOSFET becomes low and hence a large subthreshold leakage current flows since the substrate back bias voltage generator does not generate a sufficient substrate bias voltage upon power-up.

Circuits such as the above-described address buffer, etc., which are disconnected from the sub power line and the subground line, and the above-described switch MOSFETs utilize high threshold-voltage type MOSFETs to reduce the subthreshold leakage current at the time that the switch MOSFETs are brought into the off state. In the present invention, a method of forming MOSFETs whose each channel length is made long using the dependence of the threshold voltage of each MOSFET on its gate length, is used as a method of forming the MOSFETs whose each threshold voltage is high. Counter-doping to be described later is used to realize the dependence of a desired threshold voltage on the gate length.

By realizing two or more types of threshold voltages using the gate-length-dependence of the threshold voltage of each MOSFET, at least two masks (for P and N channels) can be reduced and the number of manufacturing process steps can be reduced as compared with a method of realizing two or more kinds of threshold voltages by making an ion-implantation division using conventional photomasks.

FIGS. 16A and 16B are respectively schematic structural sectional views showing examples of MOSFETs employed in a semiconductor integrated circuit device according to the present invention. FIG. 16A shows a normally-used MOSFET and FIG. 16B illustrates a counter-doped MOSFET. The term counter-dope is a means for realizing a MOSFET, which is different from the normal MOSFET shown in FIG. 16A, excellent in short channel characteristic and has a low threshold voltage, by introducing the same conductive impurities as those contained in the source and drain of a substrate surface into the MOSFET in small concentrations.

Figure 17:
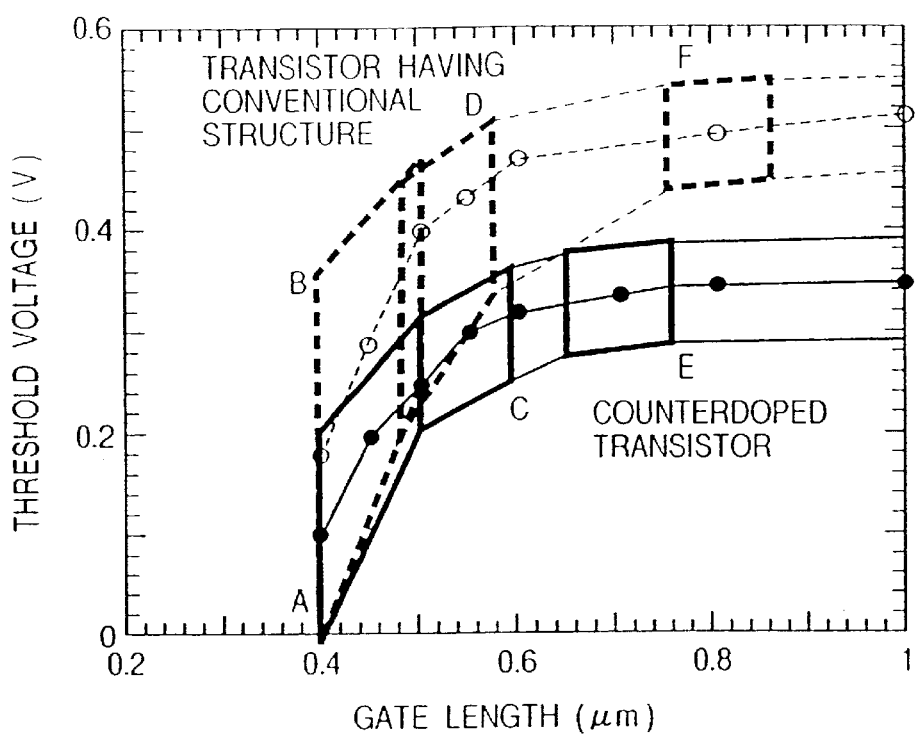
FIG. 17 is a characteristic diagram illustrating the relationship between a gate length of an N channel MOSFET and its threshold voltage to describe the present invention.

FIG. 17 is a characteristic diagram illustrating the relationship between a gate length of an N channel MOSFET and its threshold voltage. In the same drawing, symbol ○ indicates typical values of the MOSFET shown in FIG. 16A having the conventional structure. Symbol ● indicates typical values of a counter-doped transistor. These values become variations lying between upper and lower broken lines and between upper and lower solid lines, for example, due to process variations.

The allowable minimum value of each of the threshold voltages of the MOSFETs whose gate lengths are short, which constitute each internal circuit connected to the sub power line and the subground line as described above, is determined according to the subthreshold leakage current of each internal circuit at the time that each switch MOSFET is held on. In the example of the dynamic RAM shown in FIGS. 1 and 2, the allowable minimum value is about 0V at room temperature because the sum of the gate widths of the MOSFETs is about 700,000 $\mu$m. When the worst value of the threshold voltage, which is attributed to the process variations, is set to 0V, the gate length of the MOSFET becomes 0.45 $\mu$m and the threshold voltage thereof becomes 0.29V (both are typical values), for example, when the MOSFET having the conventional structure is used. On the other hand, when the counter-doped MOSFET is used, the gate length thereof becomes 0.45 $\mu$m and the threshold voltage thereof becomes 0.2V (both are typical values).

At this time, the threshold voltage causes variations within B indicated by a thick-line frame in FIG. 17 due to the process variations in the case of the MOSFET having the conventional structure. When the counter-doped MOSFET is used, the threshold voltage thereof causes variations within A indicates by a thick-line frame in FIG. 17 due to the process variations. Since the variations in threshold voltage due to the variations in gate length are reduced as a result of the suppression or control of a short channel effect by the counter-dope, the typical threshold voltages can be reduced, so that a logic circuit or the like can be designed using higher-speed MOSFETs.

The minimum value of each of the threshold voltages of the MOSFETs constituting the circuits disconnected from the sub power line VCT and the subground line VST are also determined depending on their subthreshold leakage currents. In the dynamic RAM shown in FIGS. 1 and 2, the minimum value becomes about 0.2V at room temperature. Thus, when the MOSFET having the conventional structure is used in the same manner as described above, the gate length thereof becomes 0.53 $\mu$m and the threshold voltage becomes 0.42V (both are typical values), whereas when the counter-doped MOSFET is used, the gate length thereof becomes 0.55 $\mu$m and the threshold voltage becomes 0.30V (both are typical values). The above-described threshold voltages respectively cause variations within D and C indicated by thick-line frames in FIG. 17 due to the process variations. Even in the case of the MOSFETs referred to above, high-speed MOSFETs, which are low in threshold voltage due to the counter dope, can be utilized.

When the threshold voltages of the MOSFETs for providing connections between the sub power line and the power line and between the subground line and the ground line vary, subthreshold leakage currents at their turning off greatly vary. Thus, MOSFETs in which variations in their threshold voltages due to the process variations are as small as possible and their gate lengths are long, are used as these switch MOSFETs. To cope with this, the gate length at which a curve indicative of the dependence of the threshold voltage on the gate length is substantially flat, may be set to a range from 0.7 $\mu$m to 0.8 $\mu$m or more in FIG. 17.

When the gate length of the switch MOSFET is made long, its on resistance is reduced. It is therefore necessary to increase the gate width thereof. Thus, it must be noted that the peak current at turning on of the switch MOSFET also increases. Namely, if the gate-length dependence of the threshold voltage is low, then the gate length of the switch MOSFET may be set so as to become as short as possible. Thus, in the present embodiment, when the MOSFET having the conventional structure is used, the gate length thereof becomes 0.8 $\mu$m and the threshold voltage thereof becomes 0.5V (both are typical values). Further, when the counter-doped MOSFET is used, the gate length thereof becomes 0.7 $\mu$m and the threshold voltage thereof becomes 0.35V (both are typical values). The threshold voltages respectively vary within F and E ranges indicated by thick-line frames in FIG. 17.

Although the MOSFET of the conventional structure rather than the counter-doped MOSFET bring about an advantageous effect because of its high threshold voltage from the viewpoint of the reduction in leakage current, the leakage current of the switch MOSFET is very small as compared with that of each circuit disconnected from the sub power line and the subground line referred to above. Therefore, this effect can be neglected. Since a MOSFET having a short channel, a low threshold voltage and high drive ability can be used for the switch MOSFET as a result of the control on the short channel effect by the counter dope, the gate width of the present switch MOSFET can be made smaller than that of the MOSFET having the conventional structure and the peak current can be reduced.

Figure 18:
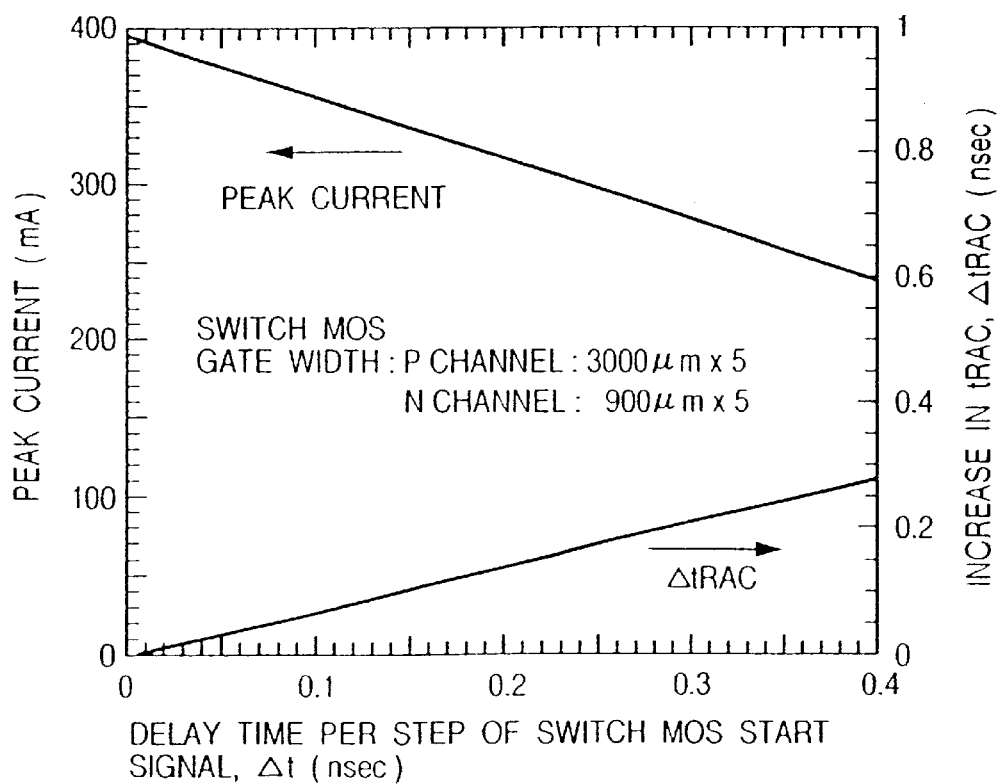

FIG. 18 is a characteristic diagram for describing the present invention. In the same drawing, the vertical axis indicates a peak current and an increase in RAS access time tARAS and the horizontal axis indicates a time difference per step of a control signal for each switch MOSFET. The result of a computer simulation using an actual dynamic RAM is illustrated in the drawing. A position or point where the time difference per step of the control signal for each switch MOSFET is 0, indicates that all the switch MOSFETs are simultaneously turned on.

The switch MOSFETs are divided into five. The gate width of each P channel MOSFET is 3000 $\mu$m and the gate width of each N channel MOSFET is 900 $\mu$m as shown in the drawing. It is understood from the same drawing that in order to reduce the peak current to 300 mA or less, for example, the switch MOSFETs are divided into plural form and a time difference of 250 psec may be provided between their control signals. It is understood that a delay (i.e., an increase in tRAS) in circuit operation at this time is controlled to 200 psec. Since the tRAS falls within a range from 40 ns to 50 ns, the delay in circuit operation due to the division of the switch MOSFETs in the plural form and the rise in the time difference is nothing but 0.5% thereof. It is thus understood from the invention of the present application that the peak current can be controlled while maintaining the speeding up of the circuit operation.

Figure 19:
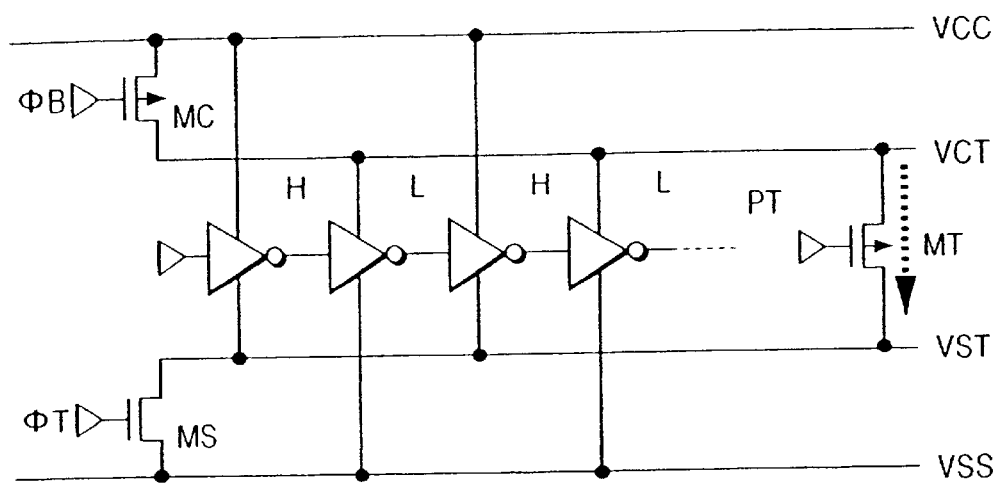
FIG. 19 is a circuit diagram illustrating another embodiment of the present invention.

FIG. 19 is a circuit diagram showing another embodiment of the present invention. A circuit formed by connecting inverters in cascade form is shown in the same drawing as an internal circuit by way of illustrative example. The first-stage inverter is supplied with a low-level input signal upon deactivation. The output of the inverter is brought to a high level (H) and the outputs of the inverters subsequent to this inverter are successively brought to a low level (L), a high level and a low level. Therefore, the inverters associated with the high levels of the outputs are electrically connected to a subground line VST and the inverters associated with the low levels of the outputs are electrically connected to the sub power line VCT.

A P channel switch MOSFET MC is provided between the sub power line VCT and a power line VCC and is switch-controlled by a control signal $\phi$B. An N channel switch MOSFET MS is provided between the subground line VST and a ground line VSS and is switch-controlled by a control signal $\phi$T. In the present embodiment, a short-circuit N channel MOSFET MT is provided between the sub power line VCT and the subground line VST. The MOSFET MT is switch-controlled by a control signal PT.

Figure 20:
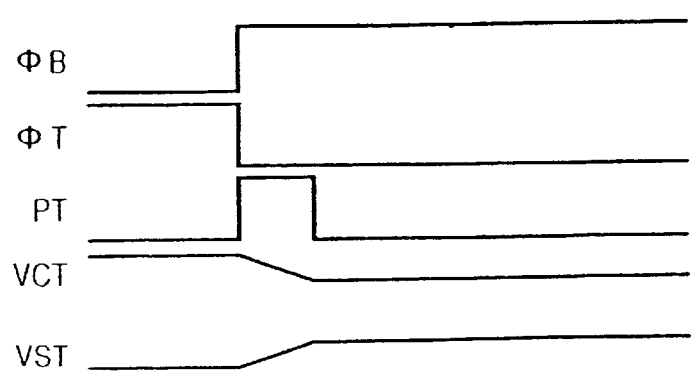
FIG. 20 is a timing chart for describing the operation of the embodiment shown in FIG. 19.

FIG. 20 is a timing chart for describing the operation of the embodiment described above. When the internal circuit changes from an active state to an inactive state, the control signal $\phi$B changes from a low to a high levels and the control signal $\phi$T changes from a high to a low levels. As a result, the switch MOSFETs MC and MS are shifted from an on state to an off state. In synchronism with this, the control signal PT is temporarily rendered high in level so that the switch MOSFET MT is turned on. Consequently, the sub power line VCT and the sub ground line VST are short-circuited so as to reach an intermediate potential, whereby power consumption can be reduced.

When the short-circuit MOSFET MT is not provided, the charge stored in the parasitic capacitance of the sub power line VCT is discharged through the turned-on N channel MOSFET of the inverter whose on-deactivation output is low in level, when the sub power line VCT and the subground VST are shifted from an on-activation voltage to an on-deactivation voltage. Conversely, the parasitic capacitance of the subground line VST is charged through the turned-on P channel MOSFET of the inverter whose on-deactivation output is high in level. The discharge and charge currents are used as currents to be used up. On the other hand, when the short-circuit MOSFET MT is provided, the sub power line VCT and the subground line VST can be varied to a predetermined potential required to reduce the subthreshold leakage current, with a charged share between their parasitic capacitances, in other words, without making special current consumption.

A pulse width of the control signal PT for switch-controlling the short-circuit MOSFET MT is set so that the voltage on each of the sub power line VCT and the subground line VST reaches just the on-deactivation voltage. Described specifically, when the parasitic capacitance is 200 pF, the pulse width of the control signal and the gate width of the switch MOSFET may be 100 ns and 10 $\mu$m respectively.

When the short-circuit MOSFET is not provided, voltage transitions of the sub power line VCT and the subground line VST need 100 $\mu$s because of the occurrence of charge and discharge due to the subthreshold leakage current. On the other hand, when the short-circuit MOSFET MT is used, the voltage transition can be completed in 100 ns.

In the above-described embodiment, in order to reduce the subthreshold leakage current by the threshold-voltage reduction, the logic gates and the inverters whose on-deactivation outputs are high in level, are electrically connected to the power line VCC and the ground sides are electrically connected to the subground line VST. In this condition, the switch MOSFETs connected to such a subground line VST are turned off. Further, the logic gates and the inverters whose on-deactivation outputs are low in level, are electrically connected to the ground line VSS and the power sides are electrically connected to the sub power line VCT. In this condition, the switch MOSFETs connected to such a sub power line VCT are turned off.

The above-described embodiment is greatly characterized in that when the above-described switches are changed from the on state to the off state, they are divided in plural form and supplied with the delayed signals so as to operate in the domino or stepwise system in order to reduce the drive currents of the switch MOSFETs each having the relatively large gate capacitance to obtain the desired on resistance and reduce the peak of the source current with the turning on of each switch MOSFET. This means that each switch MOSFET provides the reduction in subthreshold leakage current by the sub power line and the subground line and has the potential for being used as a general power switch. Namely, a large number of function blocks can be designed so as to be mounted on one semiconductor substrate with developments in semiconductor technology. One digital information processing system can be realized by itself. This tendency will be expected to greatly increase in the near future.

In this case, the large number of function blocks do not need to be placed in an operating state at all times. When, at this time, function blocks free of the need to operate exist during a period in which a predetermined data process is being carried out, it is sufficient significant that all the currents to be used up are cut off inclusive of the leakage current such as the subthreshold leakage current. In such a case, large noise is not allowed to be produced in a power line when a power switch is in an on or off state if viewed from a function block placed in an operating state. As seen from such a viewpoint, a large problem arises when a power supply for other non-operated function blocks is turned off or turned on during a period in which specific function blocks placed on one semiconductor integrated circuit device are in operation.

However, the switch MOSFETs employed in the previous embodiment can be set to the on or off state not so as to cause the peak current referred to above. Namely, the switch MOSFETs according to the present invention can be used as switch MOSFETs for selectively supplying power to each circuit block formed in the semiconductor integrated circuit device.

Figure 21:
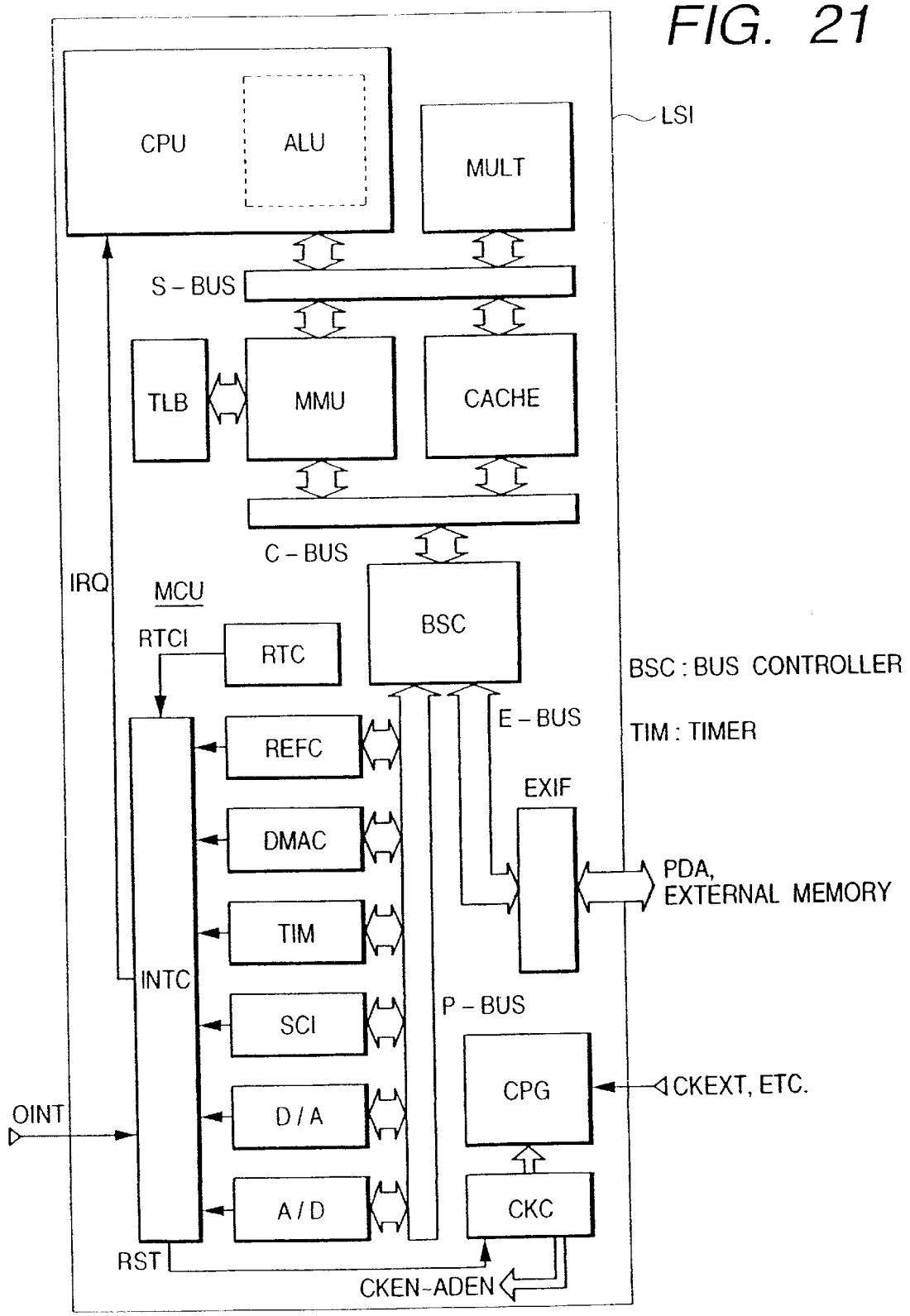
FIG. 21 is a system configurational view showing one example of a one-chip microcomputer to which the present invention is applied.

FIG. 21 is a system configurational view showing one embodiment of a one-chip microcomputer to which the present invention is applied. In a microcomputer MCU employed in the present embodiment, a central processing unit CPU of a stored program system, which includes an arithmetic and logic unit ALU, is used as a central component of the microcomputer MCU. A multiplexer MULT, a memory management unit MMU and a cache memory CACHE are electrically connected to the central processing unit CPU through a system bus S-BUS. An address conversion table TLB is connected to the memory management unit MMU. Further, on the other hand, the memory management unit MMU and the cache memory CACHE are coupled to a cache bus C-BUS. A bus controller BSC is electrically coupled to the cache bus C-BUS.

On the other hand, the bus controller BSC is connected to a peripheral bus P-BUS and an external bus E-BUS. Of these, connected to the peripheral bus P-BUS are peripheral device controllers such as a refresh controller REFC, a direct memory access controller DMAC, a timer circuit TIM, a serial communication interface SCI, a digital/analog converter D/A, an analog/digital converter A/D, etc., and a clock controller CKC. An external interface EXIF is coupled to the external bus E-BUS.

On the other hand, the refresh controller REFC, the direct memory access controller DMAC, the timer circuit TIM, the serial communication interface SCI, the digital/analog converter D/A and the analog/digital converter A/D are electrically connected to an interrupt controller INTC. The interrupt controller INTC is electrically coupled to the central processing unit CPU through an interrupt request signal IRQ. A clock pulse generator CPG and a plurality of clock switches to be described later are electrically coupled to the clock controller CKC. A portable information terminal PDA, an external memory, etc. are electrically connected to the external interface EXIF.

Also connected to the interrupt controller INTC is a real time clock circuit RTC. The real time clock circuit RTC is supplied with a clock signal having a stable frequency, which does not vary its frequency. Thus, the real time clock circuit RTC performs accurate time control.

The real time clock circuit RTC outputs an interrupt signal RTCI to the interrupt controller INTC at predetermined time intervals so as to generate an interrupt request to the central processing unit CPU at predetermined time intervals. The interrupt controller INTC is also supplied with an external interrupt signal OINT through a predetermined external terminal. Thus, an external device is logically coupled to the central processing unit CPU through the interrupt controller INTC.

In the present embodiment, the clock controller CKC includes a plurality of control registers. The central processing unit CPU writes predetermined control data into these control registers through the peripheral bus P-BUS or reads it therefrom through the peripheral bus P-BUS. The clock controller CKC selectively forms a control signal PLLON, PLLSB, C0SEL1, C0SEL2 or CKEN or the like in accordance with the control data set to the respective control registers and selectively forms a plurality of module enable signals ADEN or the like. Incidentally, these control signals and the module enable signals are indicated by one interconnection or wire to avoid drawings from being cumbersome. It is needless to say that the clock controller CKC may be electrically connected to the system bus S-BUS in place of the peripheral bus P-BUS.

Now, the central processing unit CPU is activated in synchronism with a system clock signal CK1 supplied from the clock pulse generator CPG to thereby execute a predetermined arithmetic process in accordance with a control program read from the cache memory CACHE, for example and controls and supervises respective portions of a microprocessor MPU. At this time, the arithmetic and logic unit ALU executes arithmetic and logical operations as needed and the multiplier MULT executes a multiplication process. Further, the memory management unit MMU converts a logical address outputted from the central processing unit CPU into a physical address using an address conversion table TLB upon memory access.

The cache memory CACHE is composed of a quick accessible memory. The cache memory CACHE reads and holds programs or data or the like stored in an external memory provided outside the microprocessor MPU in predetermined block units and contributes to a high-speed operation of the central processing unit CPU. The central processing unit CPU, the multiplier MULT, the memory management unit MMU and the cache memory CACHE are activated in accordance with a system clock signal CK1 having a relatively high frequency.

The bus controller BSC manages access of the respective peripheral device controllers connected to the peripheral bus P-BUS to the bus and controls the operation of each of these peripheral device controllers. On the other hand, the refresh controller RFC corresponding to one of the peripheral device controllers controls the refresh operation of the dynamic RAM (random access memory) provided as an external memory, and the direct memory access controller DMAC supports the high-speed transfer of data between the external memory and the cache memory CACHE or the like, for example.

The timer circuit TIM supports the management of time necessary for the central processing unit CPU and the serial communication interface SCI supports the transfer of serial data between the serial communication interface SCI and an external communication control device or the like. Further, the analog/digital converter A/D converts an analog signal inputted from an external sensor or the like into a digital signal represented in predetermined bits. Reversely, the digital/analog converter D/A converts a digital signal outputted from the central processing unit CPU into a predetermined analog signal and outputs it to the outside.

The interrupt controller INTC alternatively receives interrupt requests sent from the respective peripheral device controllers in a predetermined priority order and transfers the selected one to the central processing unit CPU as an interrupt request signal IRQ. The external interface EXIF controls and manages the transfer of data between the respective portions of the microcomputer MCU and the portable information terminal PDA and the external memory or the like provided at its outside and interfaces between these external devices and the microcomputer MCU. The bus controller BSC and the various peripheral device controllers are activated in synchronism with a system clock signal cks having a relatively low frequency.

In the present embodiment, the respective portions that constitute the microcomputer MCU, are formed into a single semiconductor integrated circuit device LSI under predetermined layout conditions. However, these portions thereof are designed in modules as they say and are selectively formed based on customer or user specifications. The microcomputer MCU employed in the present embodiment are provided in association with each of the plurality of modules referred to above and has a plurality of power switch MOSFETs selectively turned on in response to effective levels of their corresponding module enable signals. Such switch MOSFETs are turned off upon deactivation thereof so that current consumption thereat is substantially brought to zero.

The digital/analog converter D/A and the analog/digital converter A/D have linear circuit portions respectively. Even if they are in a non-operating state, relatively large current consumption is done. There may be often cases where they do not need to operate at all times. Thus, the current consumption at the time of the deactivation of the power switch MOSFETs can be brought to zero by interrupting the operating current with the power switch MOSFETs referred to above. Even in the case of other digital circuits which cause leakage current such as subthreshold leakage current or the like, its power cutoff is made great meaningful.

In a system which has been brought into high integration and speedup and rendered low in voltage using MOSFETs each brought to a low threshold voltage, the subthreshold leakage current presents a problem as in the dynamic RAM. It is therefore needless to say that the portions in the respective function blocks, whose on-deactivation levels are fixed, are electrically connected to the sub power line and the subground line and the switch MOSFETs connected thereto may be turned off so as to prevent the occurrence of such leakage current.

Operations and effects obtained from the above-described embodiments are as follows:

(1) A plurality of switch MOSFETs are provided in parallel form between internal power lines for a plurality of circuit blocks divided for every functions and respectively set so as to perform circuit operations in response to operation control signals and a power line for delivering an operating voltage supplied from an external terminal. These switch MOSFETs are stepwise turned on in response to control signals produced by successively delaying the operation control signals, so as to provide the supply of operating voltages. As a result, an advantageous effect can be brought about in that current consumption at the time of deactivation (non-operation) of such function blocks or modules can be brought to zero while preventing the occurrence of a peak current at the time of the on/off state of each of the switch MOSFETs.

(2) A dynamic RAM is divided into an input circuit block responsive to an input signal supplied from an external terminal, inclusive of an operation start signal, an internal circuit block activated in response to the signal inputted from the input circuit block, and an output circuit block for outputting a signal outputted from the internal circuit block to an external terminal. A plurality of switch MOSFETs are provided in parallel form between a power line for applying an operating voltage supplied from an external terminal and each internal power line for a first circuit portion in the internal circuit block, which does not need a storage operation upon its non-operating state. Further, the switch MOSFETs are stepwise turned on in response to controls signals produced by delaying a start signal supplied through the input circuit block in turn, so as to perform the supply of each operating voltage. As a result, an advantageous effect can be brought about in that the occurrence of the peak current at the time of the on/off state is avoided without sacrificing an operating speed and current consumption at the time of the deactivation (non-operation) of such each function block can be brought to zero.

(3) An advantageous effect can be brought about in that desired circuit functions can be maintained without sacrificing an operating speed by regularly supplying an operating voltage to each of the input circuit block, a second circuit portion of the internal circuit block and the output circuit block from the power line.

(4) The internal circuit block is composed of CMOS circuits. A first circuit portion of the CMOS circuits includes a circuit whose output signal is high in level when placed in a non-operating state, which is electrically connected to a first internal power line corresponding to a ground voltage, and a circuit whose output signal is low in level, which is electrically connected to a second internal power line associated with a source potential. Internal power switch circuits each composed of a plurality of switch MOSFETs stepwise turned on in response to control signals formed by delaying the start signal in turn, are respectively provided between the first internal power line and a power line and between the second internal power line and a ground line. As a result, an advantageous effect can be brought about in that the subthreshold leakage current can be reduced while maintaining an operating speed and controlling a peak current.

(5) An advantageous effect can be obtained in that threshold voltages of P channel MOSFETs and N channel MOSFETs that constitute each CMOS circuit, can be lowered so as to reduce the subthreshold leakage current while maintaining a voltage reduction and an operation speedup.

(6) The input circuit block and the output circuit block are respectively composed of CMOS circuits. P channel MOSFETs and N channel MOSFETs constituting each CMOS circuit, and MOSFETs constituting each internal power switch circuit referred to above, are set so as to be relatively large in threshold voltage as compared with the P channel MOSFETs and N channel MOSFETs of each CMOS circuit constituting the internal circuit block. As a result, an advantageous effect can be obtained in that a high-speed operation can be maintained while suppressing the subthreshold leakage current.

(7) The above-described threshold voltages are respectively set according to a MOSFET channel-length dependence. Further, each of counter-doped layers, which is of the conductive type similar to the source and drain of each MOSFET and contains a low concentration of impurities, is formed on the surface of each channel region. Thus, an advantageous effect can be brought about in that a high-speed operation and a reduction in peak current can be achieved.

(8) The internal circuit block is divided into a plurality of blocks according to its operation sequence. Further, the start signal is delayed in synchronism with the operation sequence so as to be supplied to each internal power switch circuit. Thus, an advantageous effect can be brought about in that the current at the time of on/off-changeover of each power switch is further dispersed so that the peak current can be reduced.

(9) The input circuit block corresponds to an input circuit supplied with an address signal and a control signal in an address multiplex system. The internal circuit block comprises a memory array using dynamic memory cells, an X-system address select circuit thereof, and a Y-system address select circuit. The output circuit block is divided into those such as a data input/output circuit according to the operation sequence of the dynamic RAM and the power switch MOSFETs are successively controlled. As a result, an advantageous effect can be obtained in that the peak current can be reasonably reduced while maintaining the operating speed.

(10) The internal power switch circuit provided in the Y-system address select circuit is composed of one or a plurality of MOSFETs set so as to provide the flow of an operating current necessary for the operation of such a circuit. A change in control signal supplied to the gate of each MOSFET is made slow using the fact that the time required to reach the start of its operation is long. As a result, an advantageous effect can be obtained that the peak current can be reduced in a simple structure.

(11) A short-circuit switch MOSFET temporarily turned on when internal power switch MOSFETs associated with the first internal power line and the second internal power line are turned off, is provided between the first internal power line and the second internal power line. Thus, since a charge share between the first and second internal power lines allows high-speed determination of voltages at their deactivation, an advantageous effect can be brought about in that a further reduction in subthreshold leakage current can be achieved.

Figure 22:
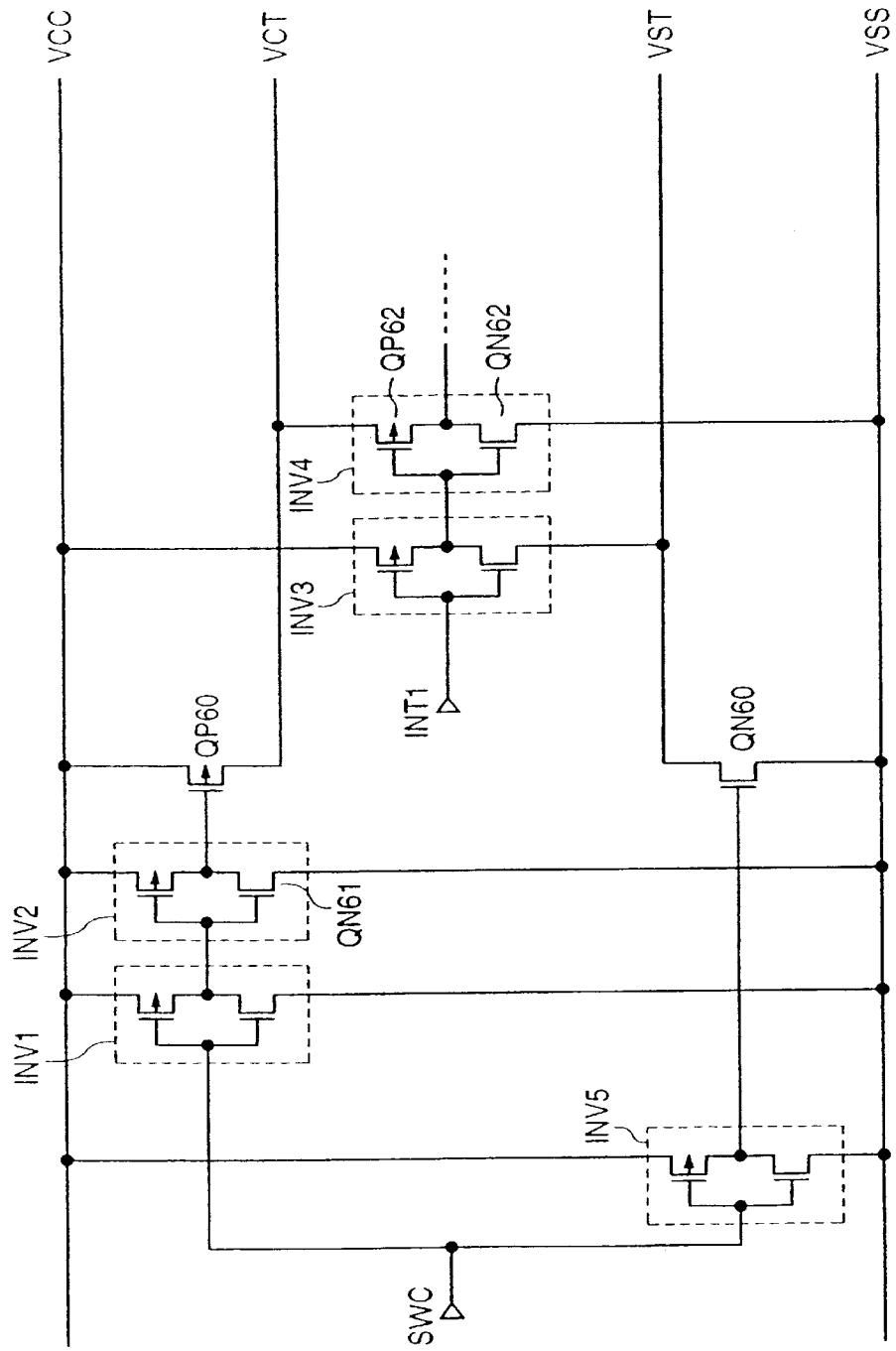
FIG. 22 is a circuit diagram illustrating a portion of the circuit shown in FIG. 14 by MOSFETs.

FIG. 22 is a circuit diagram illustrating a portion of the circuit shown in FIG. 14 by MOSFETs. CMOS inverters INV1, INV2, INV3, INV4, INV5, a P channel MOSFET QP60, a N channel MOSFET QN60, a SWC and an INT1 shown in FIG. 22 respectively correspond to the CMOS inverters INV1, INV2, INV3, INV4, INV5, the P channel MOSFET Q60, the N channel MOSFET QN60, the SWC and the INT1 shown in FIG. 14.

A subthreshold leakage current can be reduced by setting the threshold value of a MOSFET QP60 constituting an internal power switch circuit provided between a sub power line VCT and a power line VCC so as to be relatively larger than the threshold values of a P channel MOSFET QP62 and an N channel MOSFET QN62 constituting the INV4 and making a channel length-long using the dependence of a threshold value on a gate length.

The CMOS inverter INV2 shown in FIG. 22 is a circuit for controlling the internal power switch circuit QP60 and cannot be connected to the sub power line VCT and a subground line VST.

Therefore, a channel length is made long using a gate-length dependence and the threshold value of the CMOS inverter INV2 is set so as to relatively larger than the threshold values of the P channel MOSFET QP62 and the N channel MOSFET QN62 constituting the INV4. As a result, a subthreshold leakage current can be reduced.

The counter dope described with reference to FIG. 16B is used for the MOSFETs that constitute the CMOS inverters INV1, INV2, INV3, INV4 and INV5, for example. For example, a channel length of an N channel MOSFET QN61, which constitutes the CMOS inverter INV2, is made long using the dependence of its threshold voltage on the gate length thereof so as to reduce the subthreshold leakage current. However, the threshold voltage of the N channel MOSFET QN61 will cause process variations.

Therefore, the counter dope described with reference to FIG. 16B is used to reduce variations in the threshold voltage due to the process variations of the N channel MOSFET QN61. Thus, the threshold voltage of the N channel MOSFET QN61 can be reduced and the N channel MOSFET QN61 that forms the N channel MOSFET QN61, can be activated at high speed.

The inventions made by the present inventors, have been specifically described based on the embodiments. However, the inventions of the present application are not necessarily limited to the above-described embodiments. It is needless to say that various changes can be made thereto without departing the gist of the present invention. A method of forming MOSFETs each having such a threshold voltage as to substantially avoid a problem offered by the subthreshold leakage current as in the case of, for example, the input portion, the output circuit and the power switch MOSFETs, can take various forms such as the utilization of the channel-length dependence, an increase in the density of impurities at a channel portion, control on gate insulating films or the supply of a deep back bias to a substrate with the MOSFETs formed therein, etc.

In the internal circuit employed in the dynamic RAM, the operation mode is set by the control signal supplied from the external terminal. However, the operation mode may be determined by a command as in a synchronous dynamic RAM. In this case, the switch MOSFETs may be controlled by a control timing circuit supplied with a command data output. In a static RAM, each switch MOSFET may be controlled by a chip enable signal. However, since a circuit operating mode exists in a static RAM for a cache memory even if an external input signal is not varied, a switch MOS control circuit may also perform switch control based on a mode decision signal or the like correspondingly. The present invention is applicable to various semiconductor integrated circuit devices each composed of MOSFETs as well as to the memory circuit and the one chip microcomputer referred to above.

Advantageous effects obtained by a typical one of the inventions disclosed in the present application will be described in brief as follows: A plurality of switch MOSFETs are provided in parallel form between internal power lines for a plurality of circuit blocks divided for every functions and respectively set so as to perform circuit operations in response to operation control signals and a power line for delivering an operating voltage supplied from an external terminal. These switch MOSFETs are stepwise turned on in response to control signals produced by successively delaying the operation control signals, so as to provide the supply of operating voltages. As a result, current consumption at the time of deactivation (non-operation) of such function blocks or modules can be brought to zero while preventing the occurrence of a peak current at the time of the on/off state of each switch MOSFET.

A dynamic RAM is divided into an input circuit block responsive to an input signal supplied from an external terminal, inclusive of an operation start signal, an internal circuit block activated in response to the signal inputted from the input circuit block, and an output circuit block for outputting a signal outputted from the internal circuit block to an external terminal. A plurality of switch MOSFETs are provided in parallel form between a power line for applying an operating voltage supplied from an external terminal and an internal power line for a first circuit portion in the internal circuit block, which does not need a storage operation upon its non-operating state. Further, the switch MOSFETs are turned on in a domino mode in response to controls signals produced by delaying a start signal in turn, so as to perform the supply of each operating voltage. As a result, the occurrence of the peak current at the time of the on/off state of each MOSFET can be avoided without sacrificing an operating speed and current consumption at the time of the deactivation (non-operation) of such each function block can be brought to zero.

Having now fully described the invention, it will be apparent to those skilled in the art that many changes and modifications can be made without departing from the spirit or scope of the invention as set forth herein.

We claim:

1. A semiconductor device comprising:

a plurality of memory cells;

a plurality of sense amplifiers;

a first address decoder, said first address decoder including a plurality of MOSFETs;

a second address decoder, said first address decoder including a plurality of MOSFETs;

a first circuit provided in order to reduce a subthreshold leakage current of said plurality of MOSFETs of said first address decoder;

a second circuit provided in order to reduce a subthreshold leakage current of said plurality of MOSFETs of said second address decoder; and a third circuit provided in order to reduce a subthreshold leakage current of said plurality of sense amplifiers, wherein said first, second and third circuits are activated at different timings from each other.

2. A semiconductor device according to claim 1, wherein said third circuit activates after said first circuit activates, and wherein said second circuit activates after said third circuit activates.

* * * * *